(12) United States Patent
Kikuchi et al.

(10) Patent No.: US 11,069,748 B2
(45) Date of Patent: *Jul. 20, 2021

(54) ORGANIC ELECTROLUMINESCENCE DEVICE AND ELECTRONIC APPARATUS

(71) Applicant: Sony Corporation, Tokyo (JP)

(72) Inventors: Koji Kikuchi, Kanagawa (JP); Mamoru Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/837,435

(22) Filed: Apr. 1, 2020

(65) Prior Publication Data
US 2020/0295097 A1    Sep. 17, 2020

Related U.S. Application Data

(63) Continuation of application No. 16/246,098, filed on Jan. 11, 2019, now Pat. No. 10,644,076, which is a
(Continued)

(30) Foreign Application Priority Data

Jan. 31, 2014   (JP) .................................. 2014-017438

(51) Int. Cl.
*H01L 27/32* (2006.01)
*G02B 5/20* (2006.01)
(Continued)

(52) U.S. Cl.
CPC .......... *H01L 27/3213* (2013.01); *G02B 5/201* (2013.01); *G02B 5/223* (2013.01); *H01L 27/322* (2013.01); *H01L 27/3211* (2013.01); *H01L 27/3246* (2013.01); *H01L 51/5209* (2013.01); *H01L 51/5218* (2013.01);
(Continued)

(58) Field of Classification Search
None
See application file for complete search history.

(56) References Cited

U.S. PATENT DOCUMENTS 5,558,927 A     9/1996 Aruga
10,229,955 B2 *  3/2019 Kikuchi .............. H01L 27/3213
(Continued)

FOREIGN PATENT DOCUMENTS

JP    H08-278497 A    10/1996
JP    2004-527088 A    9/2004
(Continued)

*Primary Examiner* — Lex H Malsawma
(74) *Attorney, Agent, or Firm* — Michael Best & Friedrich LLP

(57) ABSTRACT

A organic electroluminescence device includes: a plurality of pixels each including an organic layer and a second electrode in this order on a first electrode having light reflectivity, and each configured to emit light of one wavelength out of two or more different wavelengths, the organic layer including an organic electroluminescence layer; and a black matrix layer provided on light emission side of the second electrode, and having first apertures for the respective pixels. The black matrix layer has inclined surfaces inside the respective first apertures, and inclination angles of the inclined surfaces are set, based on emission wavelengths of the pixels.

10 Claims, 22 Drawing Sheets

Related U.S. Application Data continuation of application No. 15/102,766, filed as application No. PCT/JP2014/081988 on Dec. 3, 2014, now Pat. No. 10,229,955.

(51) Int. Cl.
*G02B 5/22* (2006.01)
*H01L 51/52* (2006.01)

(52) U.S. Cl.
CPC ...... *H01L 51/5246* (2013.01); *H01L 51/5271* (2013.01); *H01L 51/5284* (2013.01)

(56) References Cited

U.S. PATENT DOCUMENTS

| | | | |
|---|---|---|---|
| 10,644,076 B2 * | 5/2020 | Kikuchi | ............ H01L 27/3246 |
| 2003/0011304 A1 | 1/2003 | Duineveld | |
| 2003/0107314 A1 | 6/2003 | Urabe et al. | |
| 2003/0230972 A1 | 12/2003 | Cok | |
| 2004/0125278 A1 * | 7/2004 | Park | ................. G02F 1/133514 |
| | | | 349/106 |
| 2005/0030449 A1 | 2/2005 | Kocha | |
| 2006/0255337 A1 | 11/2006 | Jun | |
| 2007/0172586 A1 * | 7/2007 | Tachikawa | ............. G02B 5/201 |
| | | | 427/162 |
| 2007/0291385 A1 | 12/2007 | Kim | |
| 2008/0136990 A1 | 6/2008 | Kimura | |
| 2008/0166641 A1 | 7/2008 | Kim | |
| 2008/0224963 A1 | 9/2008 | Takagi | |
| 2008/0272681 A1 | 11/2008 | Cha | |
| 2010/0117528 A1 * | 5/2010 | Fukuda | ................. H01L 27/322 |
| | | | 313/505 |
| 2012/0250303 A1 | 10/2012 | Asaki | |
| 2014/0036179 A1 | 2/2014 | Huang | |
| 2014/0231790 A1 * | 8/2014 | Fujino | ................. H01L 27/3213 |
| | | | 257/40 |

FOREIGN PATENT DOCUMENTS

| | | |
|---|---|---|
| JP | 2005-063781 A | 3/2005 |
| JP | 2005-173092 A | 6/2005 |
| JP | 2005-310713 A | 11/2005 |
| JP | 2006-120477 A | 5/2006 |
| JP | 2006-185790 A | 7/2006 |
| JP | 2010-060802 A | 3/2010 |
| JP | 2010-231076 A | 10/2010 |
| JP | 2011-187441 A | 9/2011 |
| JP | 2013-191553 A | 9/2013 |
| WO | WO-2013051428 A1 * | 4/2013 ......... H01L 27/3213 |

* cited by examiner

[ FIG. 1 ]
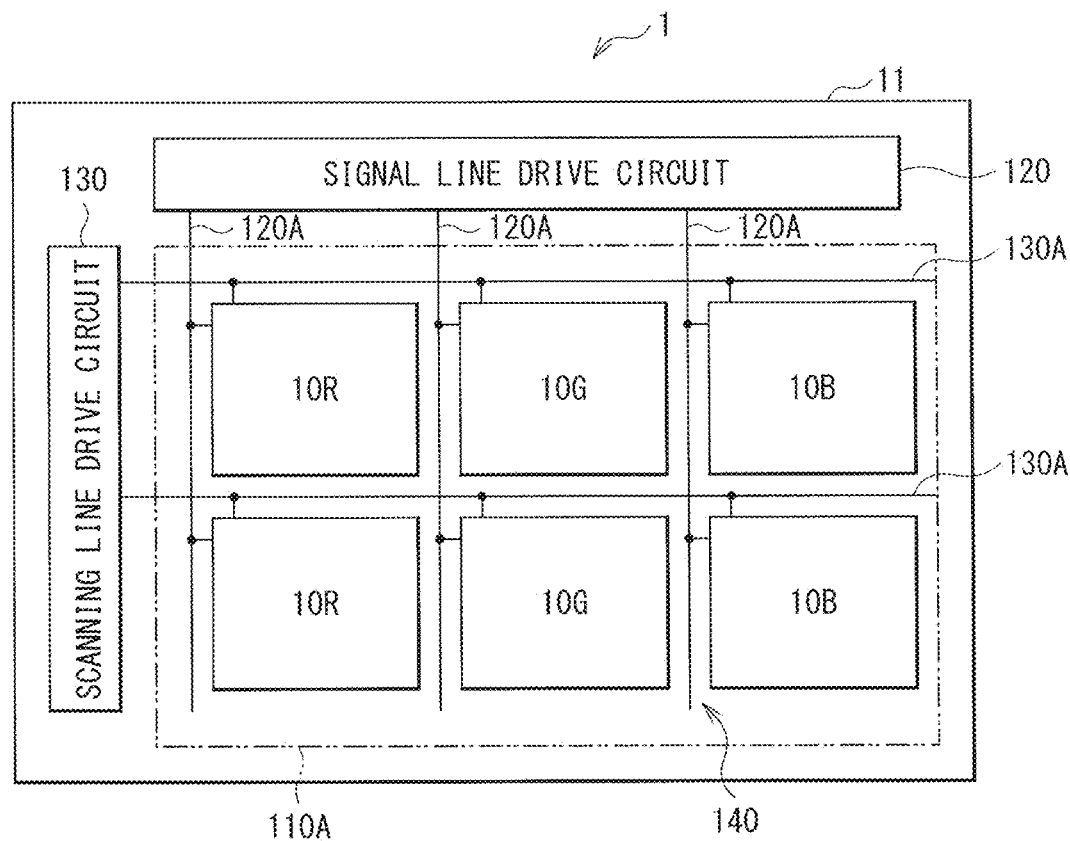
[ FIG. 2 ]
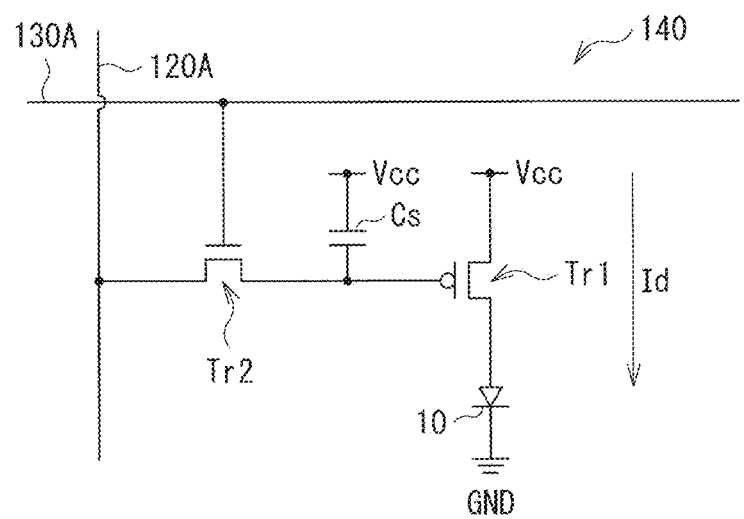

[FIG. 3]
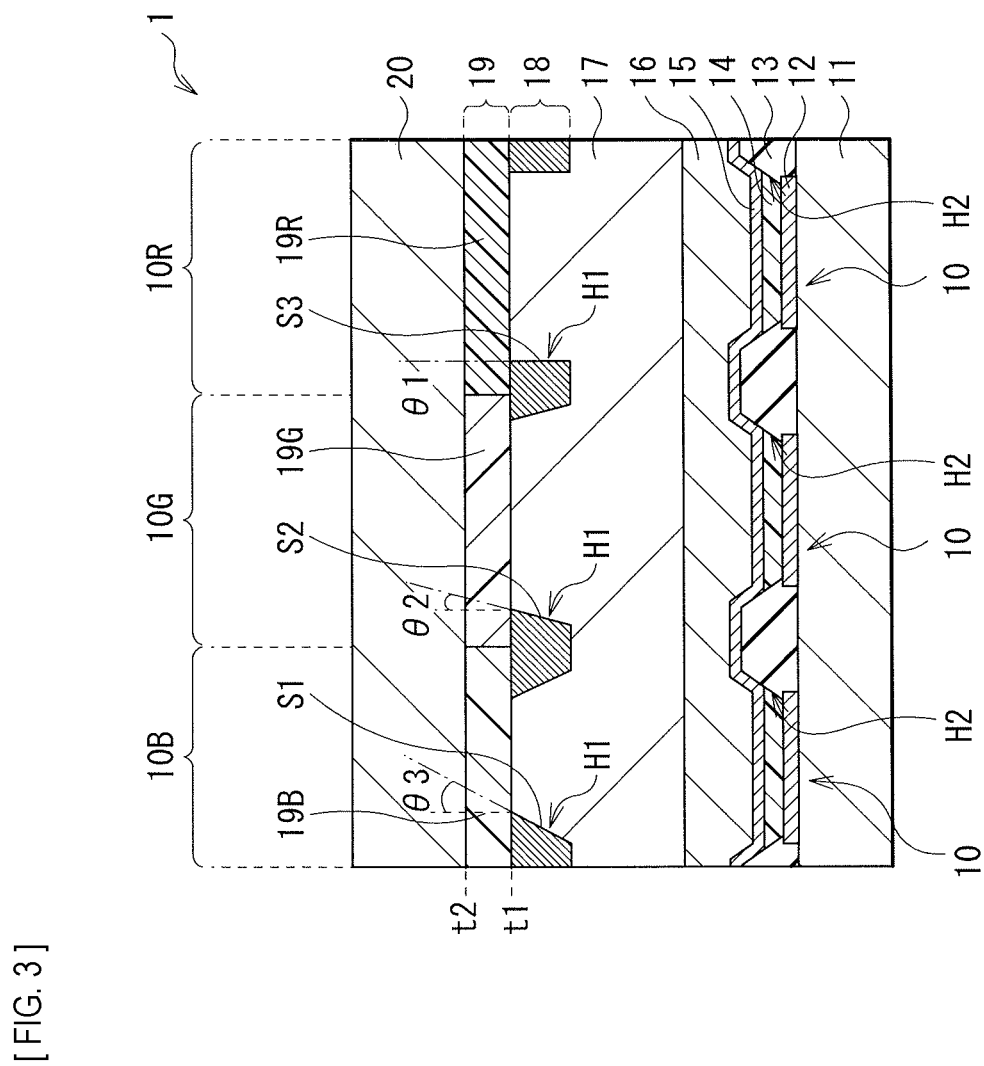

[ FIG. 4 ]
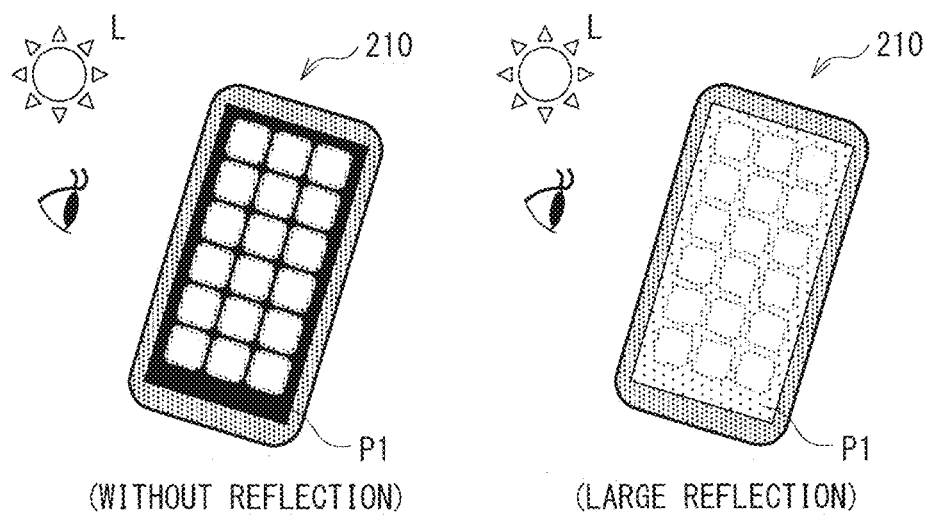
(WITHOUT REFLECTION)  (LARGE REFLECTION)
[ FIG. 5 ]
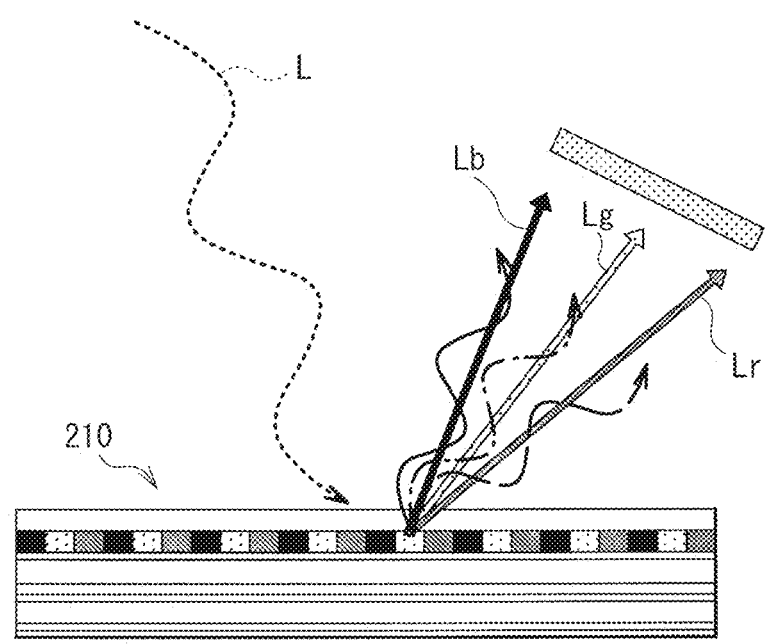

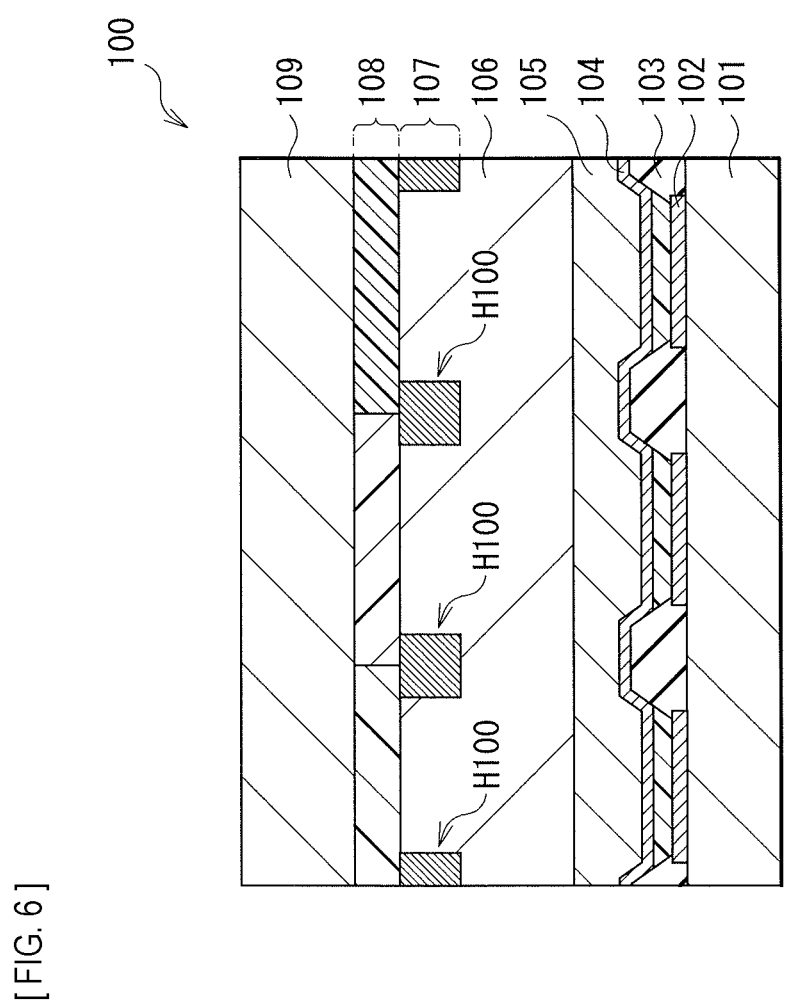
[FIG. 6]

[FIG. 7]
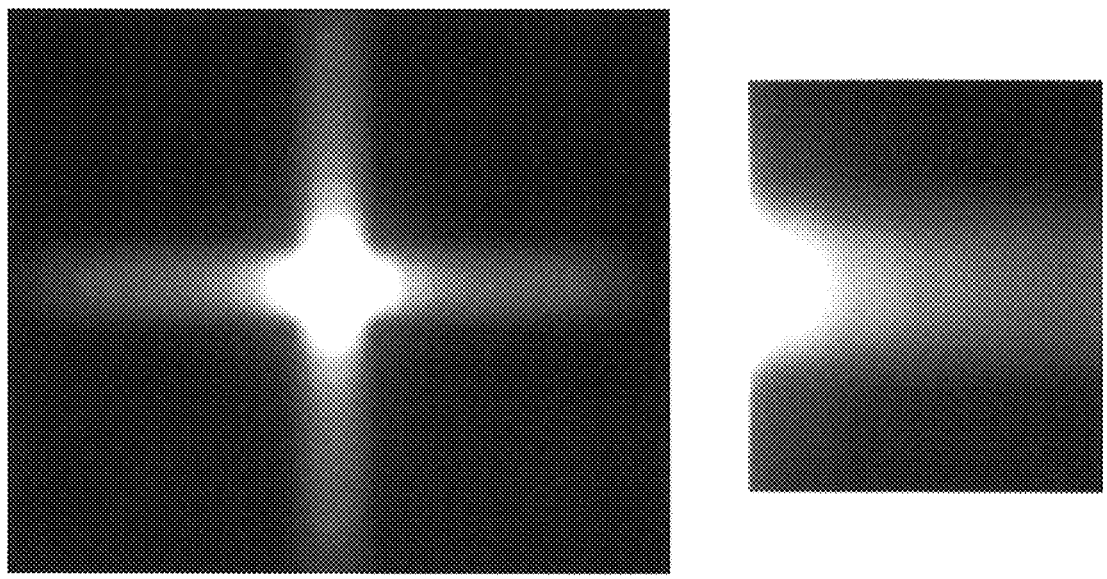
COMPARATIVE EXAMPLE 1
[FIG. 8]
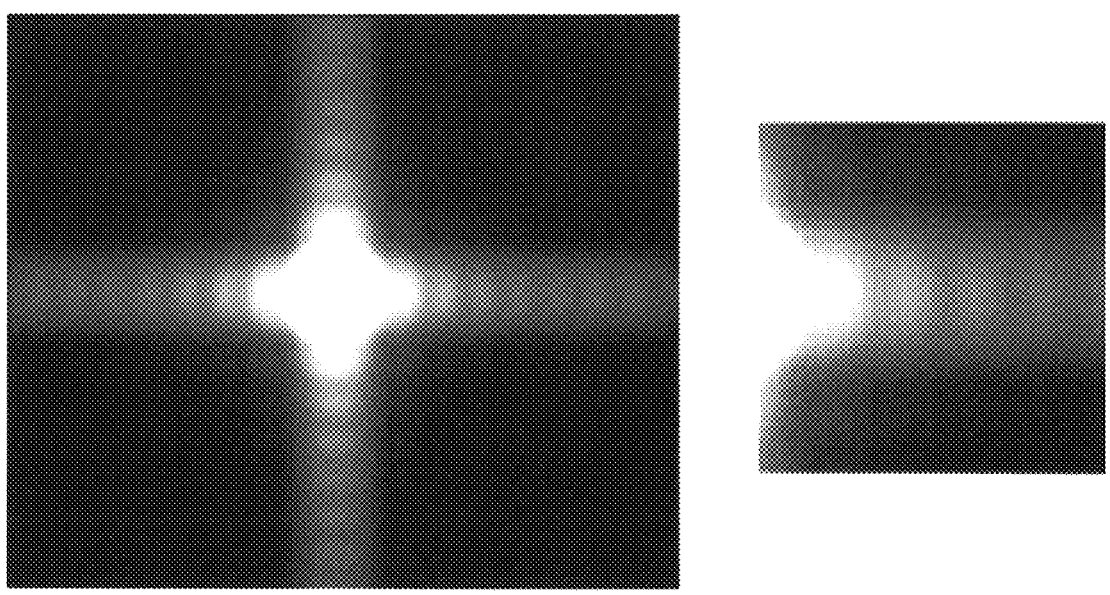
EXAMPLE 1

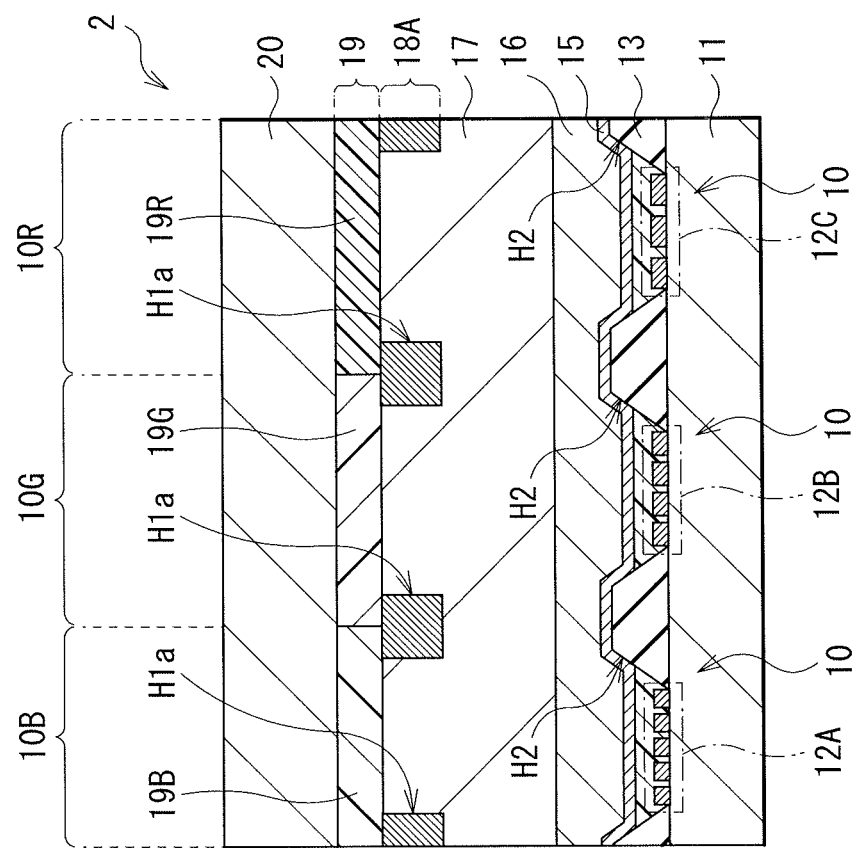
[FIG. 9]

[FIG. 10]
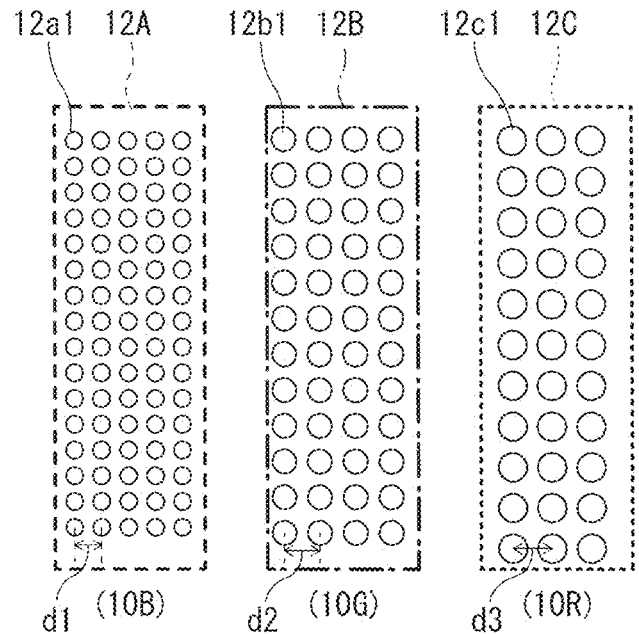
[FIG. 11]
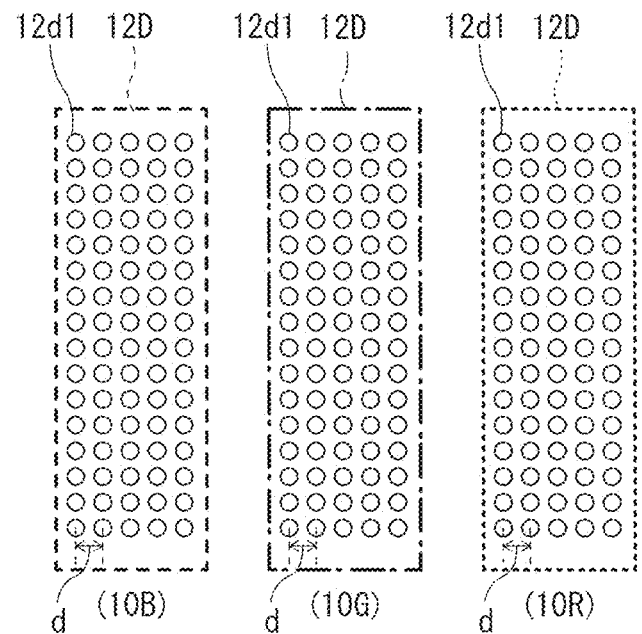

[ FIG. 12 ]
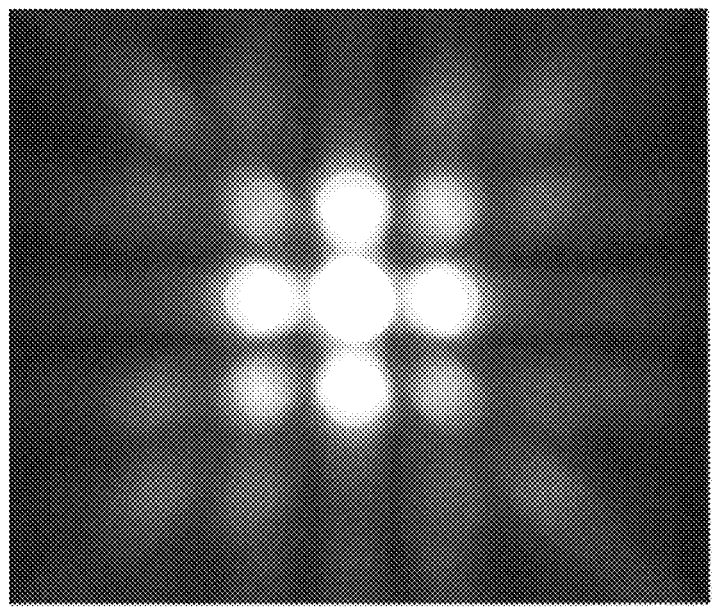
COMPARATIVE EXAMPLE 2
[ FIG. 13 ]
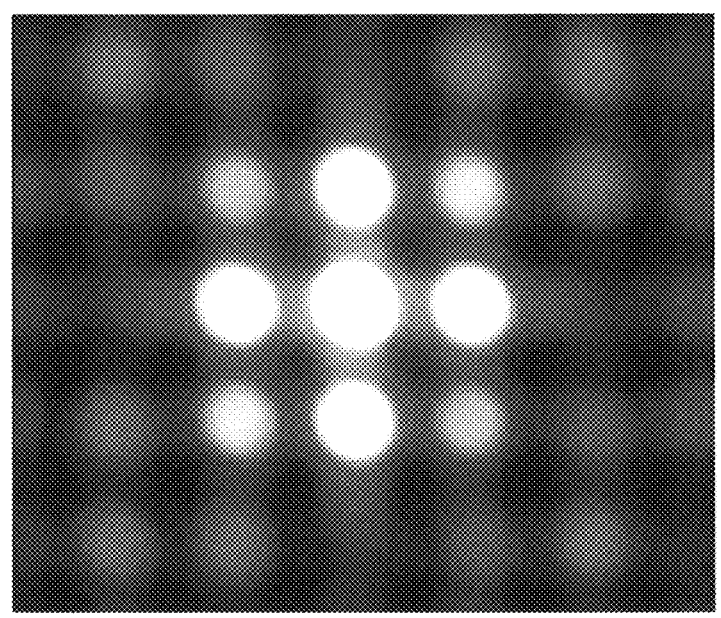
EXAMPLE 2

[ FIG. 14 ]
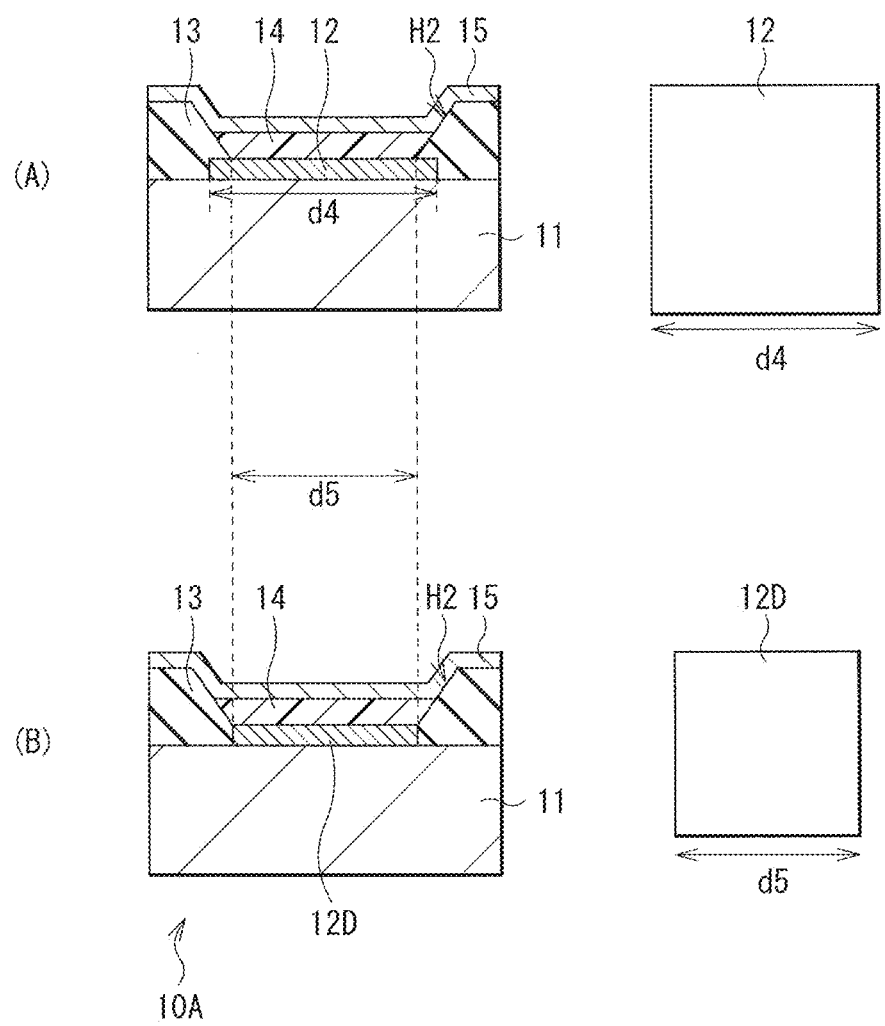

[ FIG. 15 ]
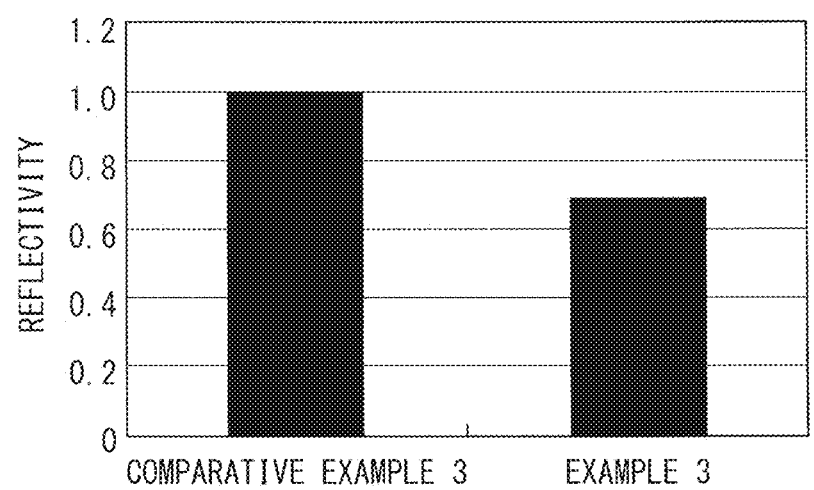

[FIG. 16]
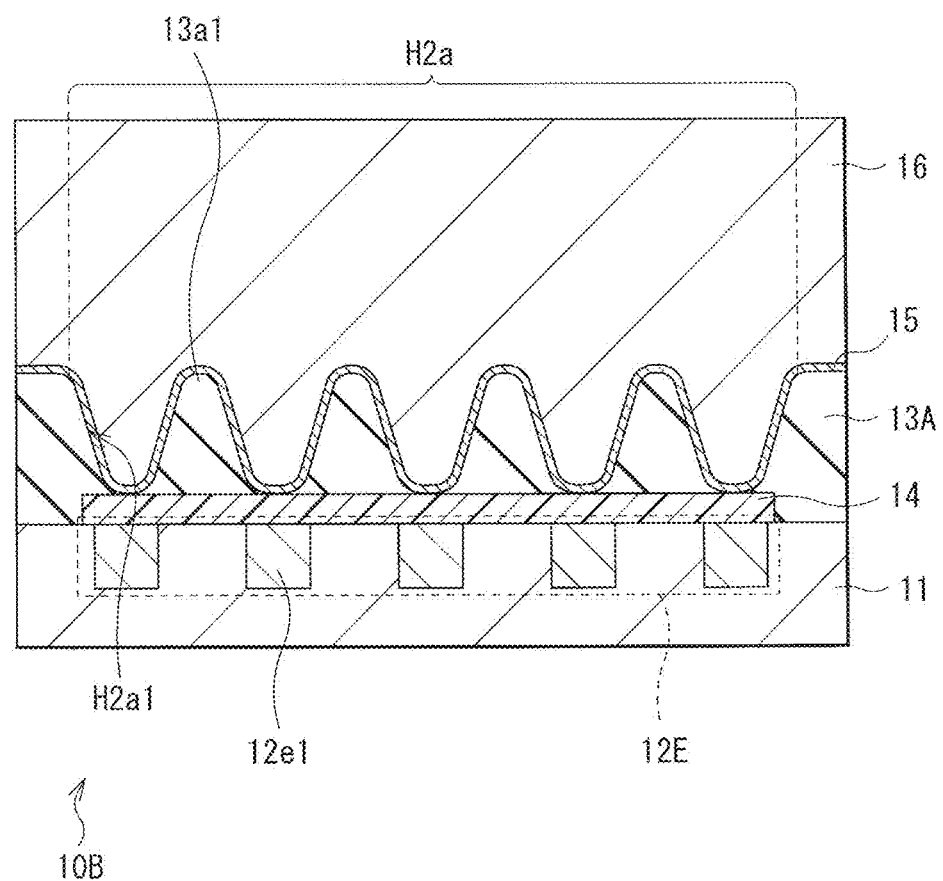

[ FIG. 17 ]
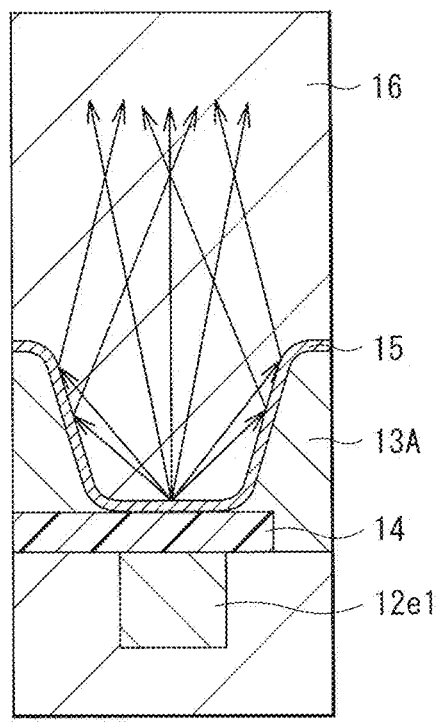
[ FIG. 18 ]
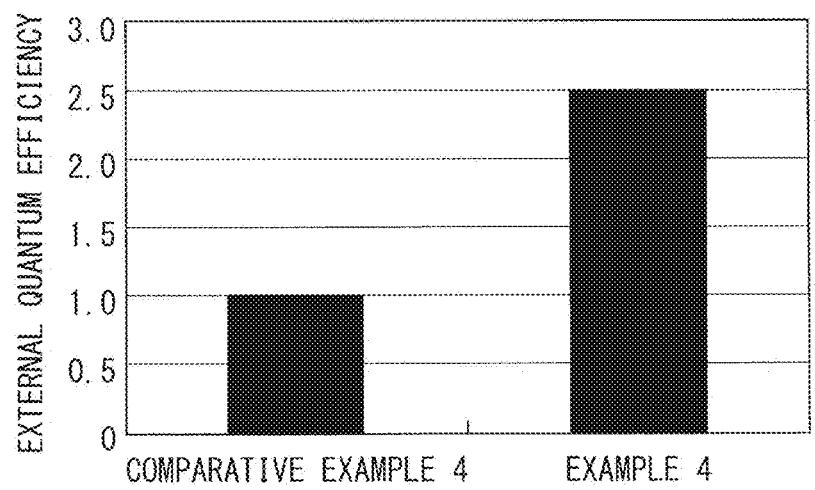

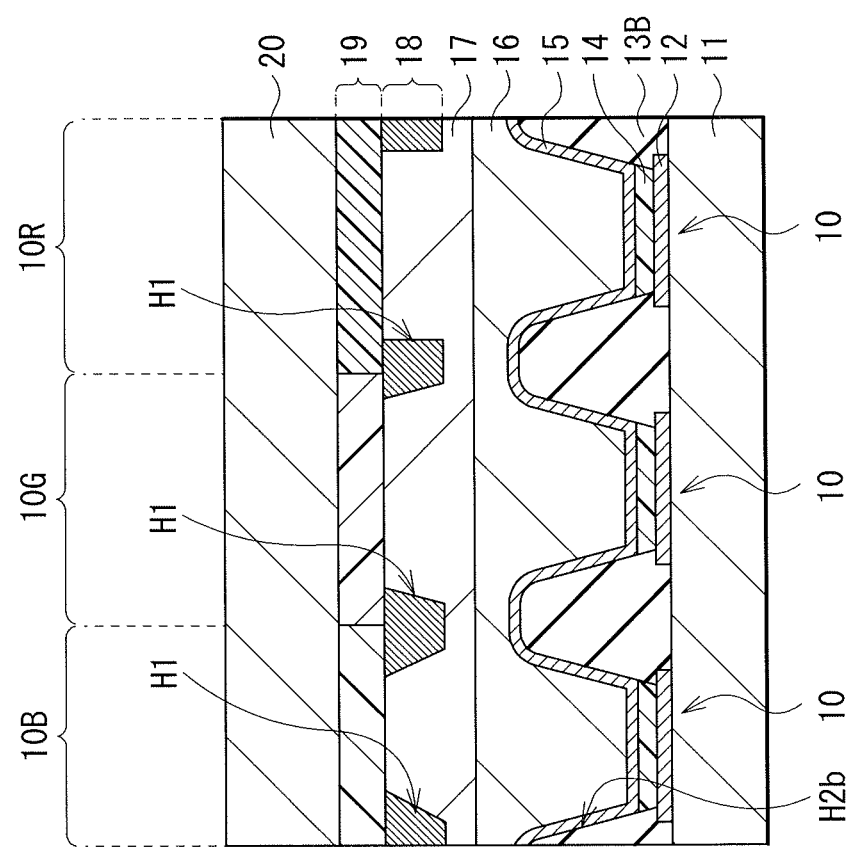
[FIG. 19]

[ FIG. 20 ]
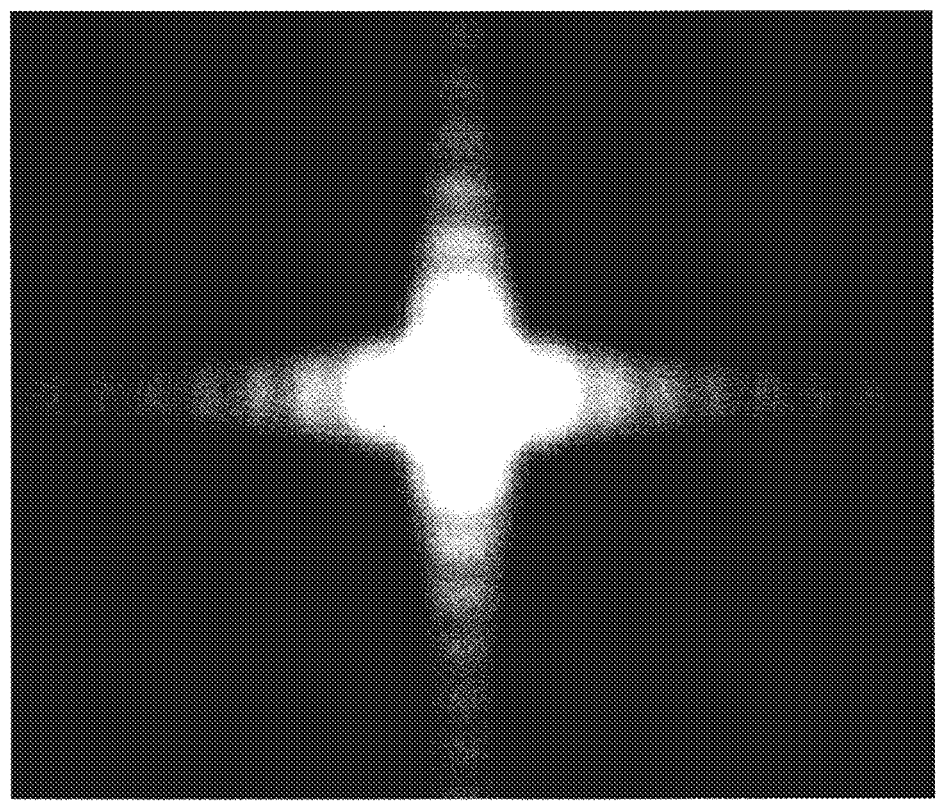
EXAMPLE 5

[FIG. 21A]
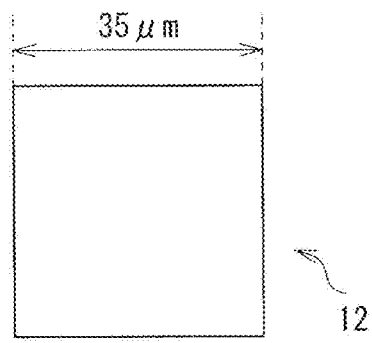
[FIG. 21B]
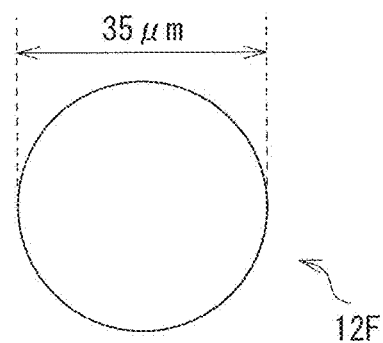

[ FIG. 22 ]
COMPARATIVE EXAMPLE 6
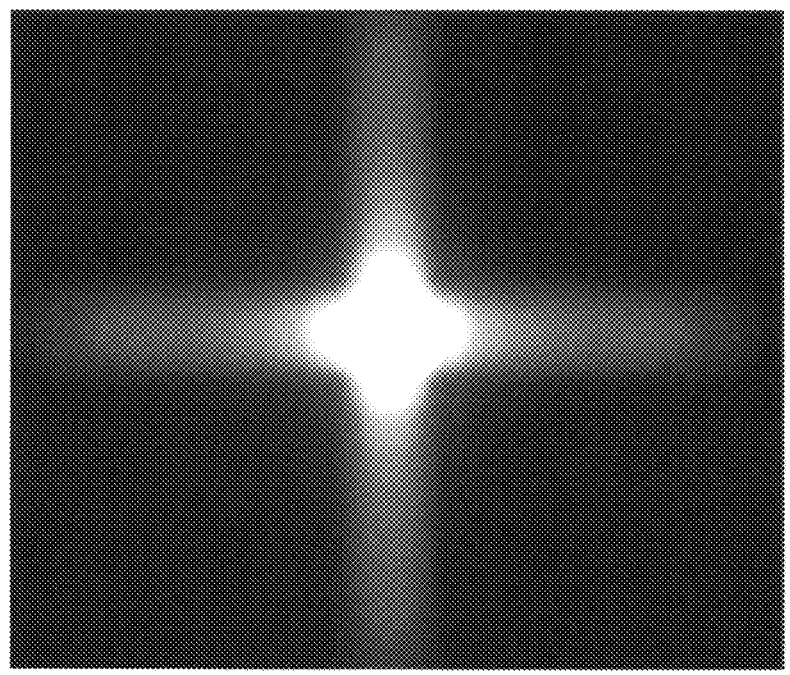
[ FIG. 23 ]
EXAMPLE 6
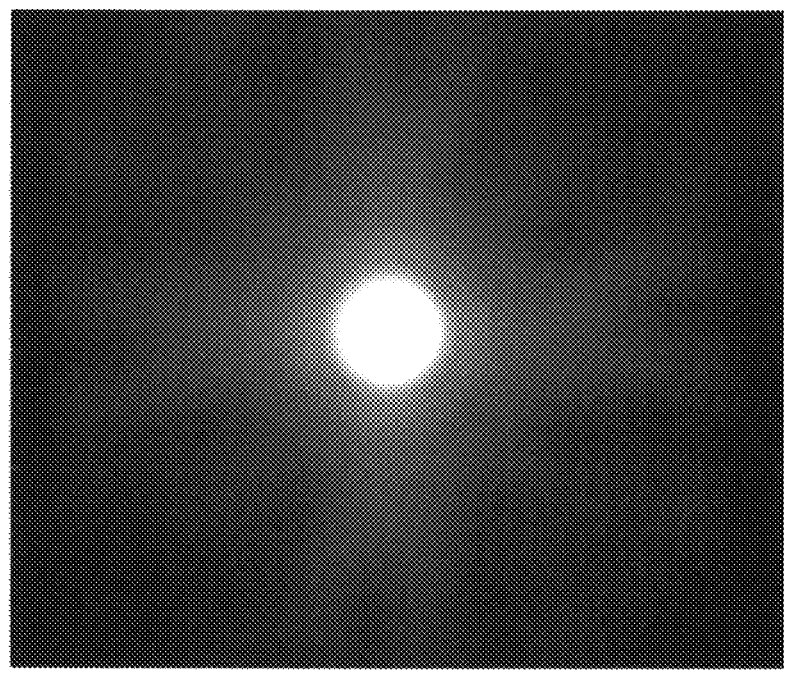

[FIG. 24]
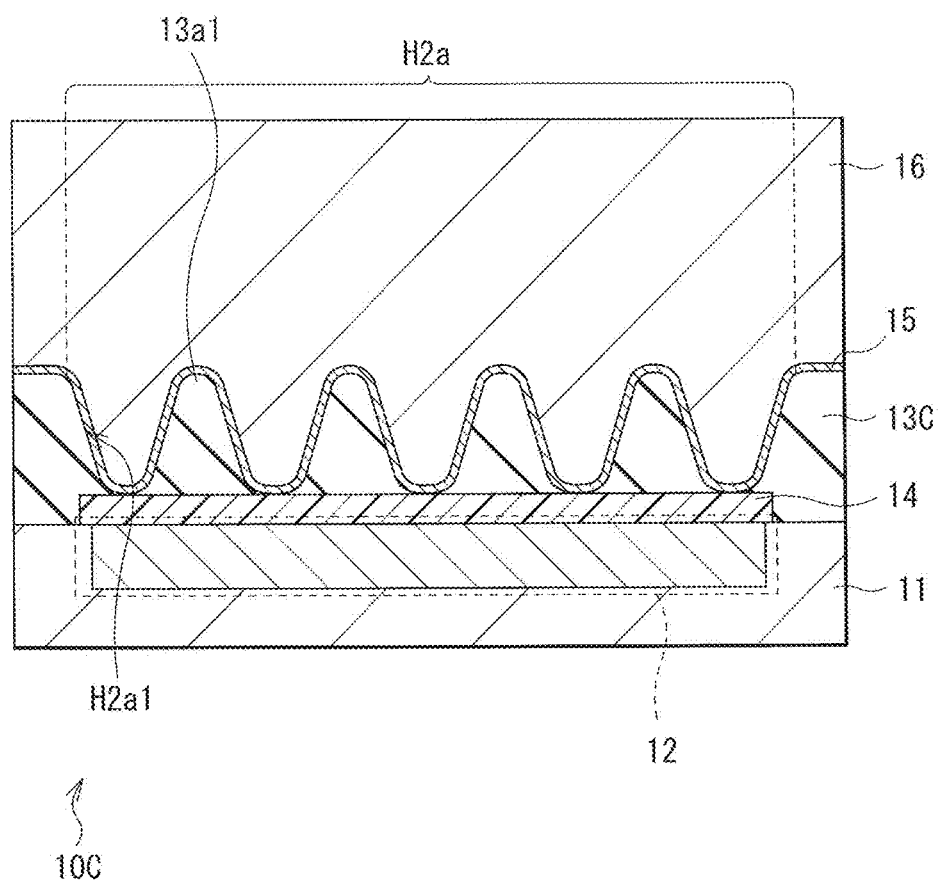
[FIG. 25]
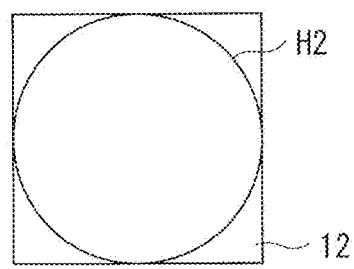

[FIG. 26]
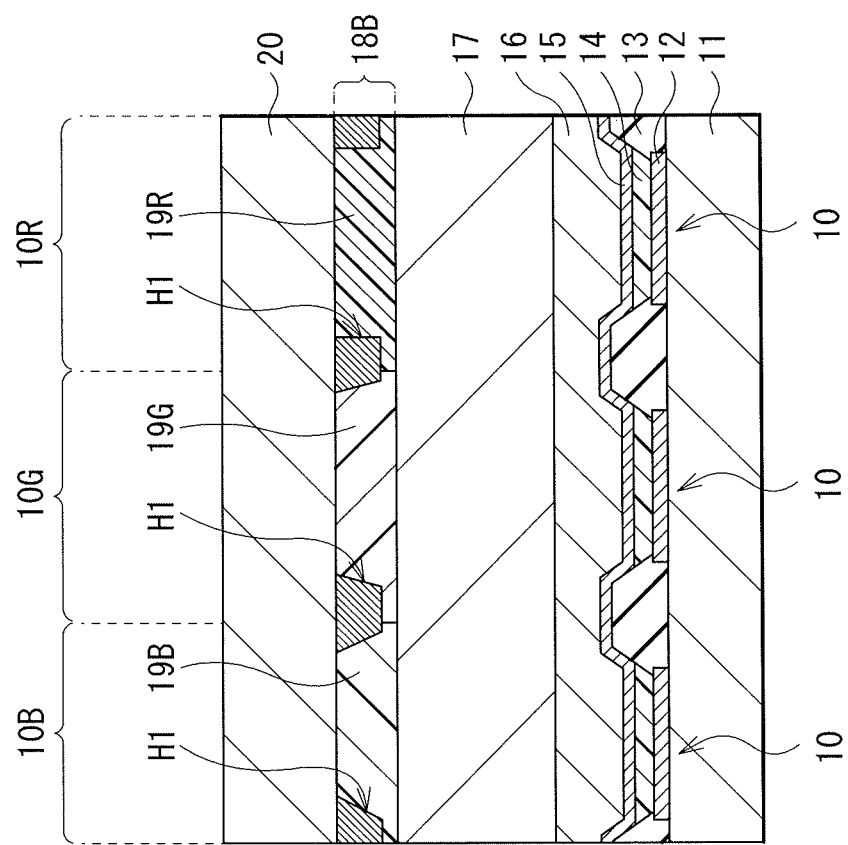

[ FIG. 27A ]
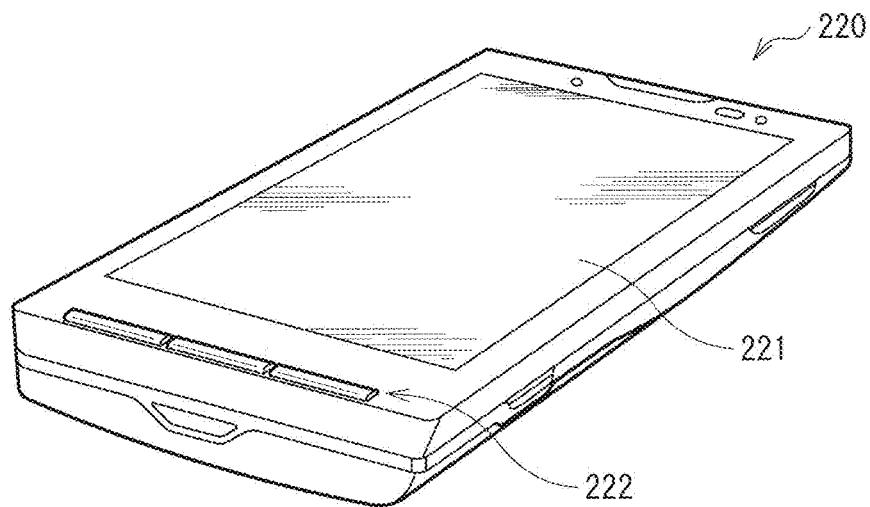
[ FIG. 27B ]
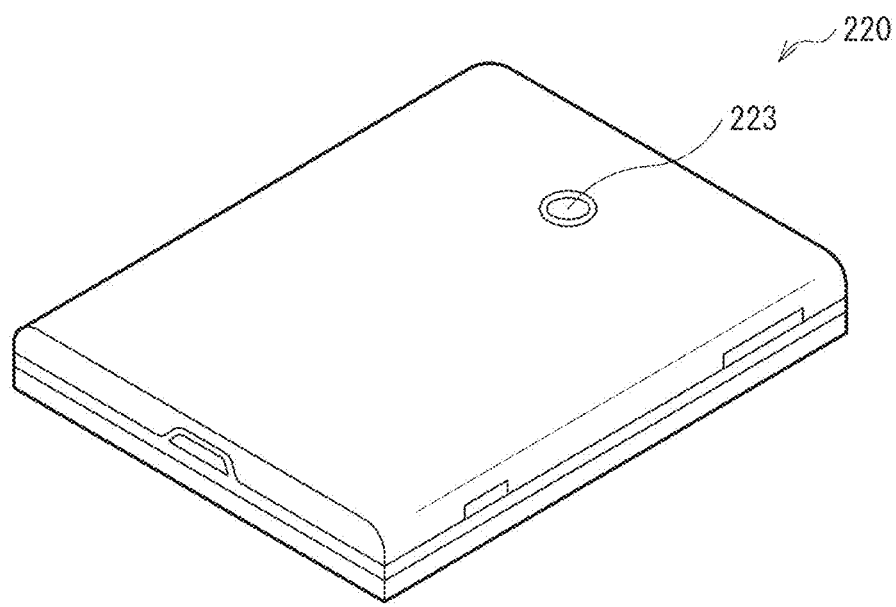

[FIG. 28]
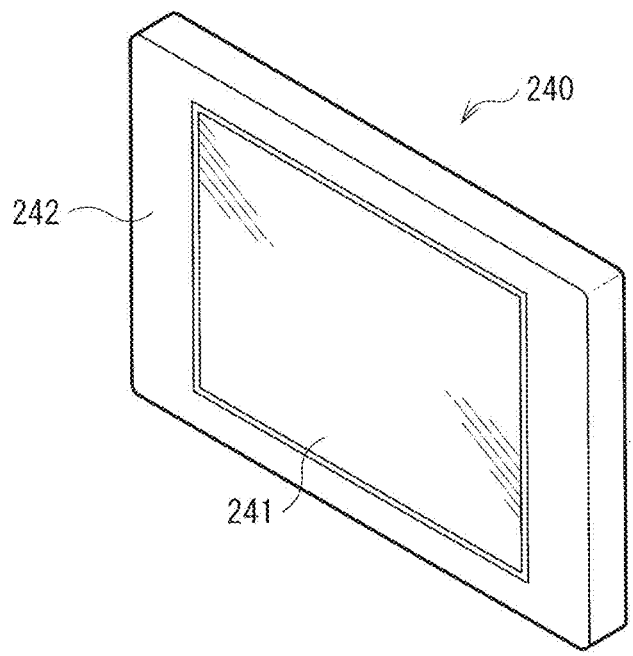

[ FIG. 29A ]
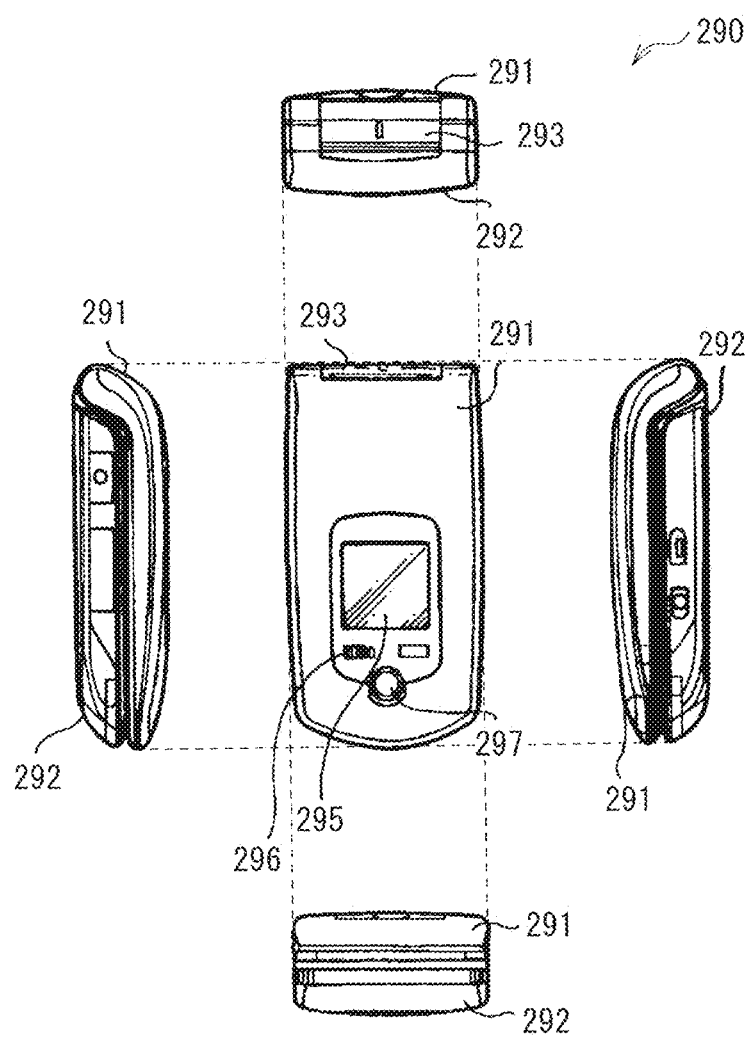

[ FIG. 29B ]
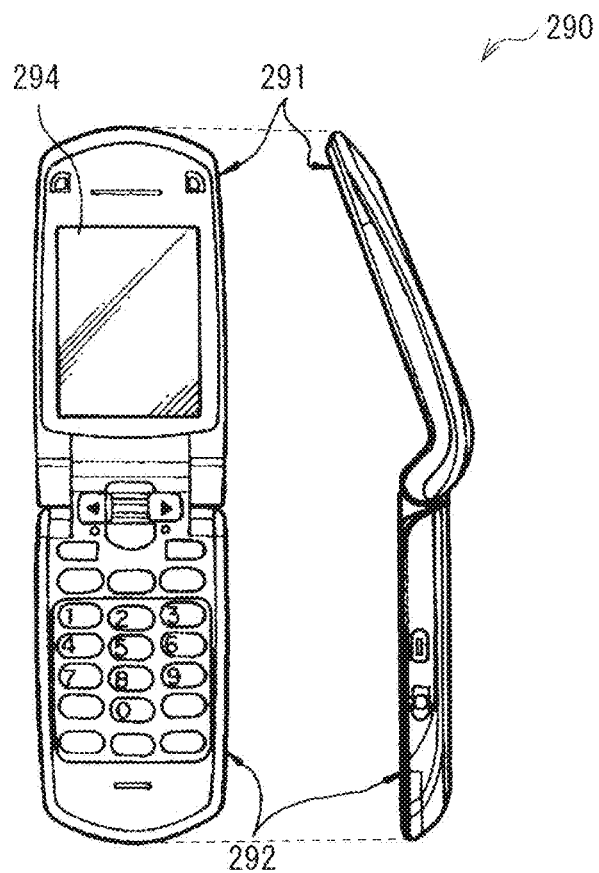

ORGANIC ELECTROLUMINESCENCE DEVICE AND ELECTRONIC APPARATUS

CROSS REFERENCES TO RELATED APPLICATIONS

The present Application is a Continuation Application of U.S. patent application Ser. No. 16/246,098 filed Jan. 11, 2019, which is a Continuation Application of U.S. patent application Ser. No. 15/102,766 filed Jun. 8, 2016, now U.S. Pat. No. 10,229,955, issued on Mar. 12, 2019, which is a 371 National Stage Entry of International Application No.: PCT/JP2014/081988, filed on Dec. 3, 2014, which in turn claims priority from Japanese Application No. 2014-017438, filed on Jan. 31, 2014, the entire contents of which are incorporated herein by reference.

TECHNICAL FIELD

The disclosure relates to an organic electroluminescence device that emits light with use of an organic electroluminescence (EL) phenomenon, and an electronic apparatus using the organic electroluminescence device.

BACKGROUND ART

Organic electroluminescence elements each include an organic layer between a lower electrode and an upper electrode. The organic layer includes an organic electroluminescence layer. Attention has focused on the organic electroluminescence elements as light-emitting elements that allow for high-luminance light emission by direct-current driving at low voltage.

For an active matrix light-emitting device (organic electroluminescence device) using the organic EL elements, there is disclosed technology of improving light extraction efficiency by adoption of a so-called anode reflector (refer to Patent Literature 1, for example).

CITATION LIST

Patent Literature

Patent Literature 1: Japanese Unexamined Patent Application Publication No. 2013-191533

SUMMARY OF INVENTION

The organic electroluminescence device as mentioned above may be used under irradiation with intense light in some cases. It is therefore desired to keep favorable visibility even under such a condition.

It is therefore desirable to provide an organic electroluminescence device and an electronic apparatus that make it possible to suppress deterioration in visibility caused by reflection of outside light.

An organic electroluminescence device according to an embodiment of the disclosure includes: a plurality of pixels each including an organic layer and a second electrode in this order on a first electrode having light reflectivity, and each configured to emit light of one wavelength out of two or more different wavelengths, the organic layer including an organic electroluminescence layer; and a black matrix layer provided on light emission side of the second electrode, and having first apertures for the respective pixels. The black matrix layer has inclined surfaces inside the respective first apertures, and inclination angles of the inclined surfaces are set, based on emission wavelengths of the pixels.

An electronic apparatus according to an embodiment of the disclosure includes the organic electroluminescence device according to the foregoing embodiment of the disclosure.

In the organic electroluminescence device and the electronic apparatus according to the embodiments of the disclosure, the black matrix layer has the inclined surfaces inside the respective first apertures, and the inclination angles of the inclined surfaces are set, based on the emission wavelengths of the pixels. This makes it possible to have a different reflection intensity distribution for each pixel. Rainbow-like coloring caused by reflection of outside light may be seen due to a difference in diffraction pattern between wavelengths included in the outside light. However, each of the pixels (each of the wavelengths) has a different reflection intensity distribution, which makes it possible to make such coloring unnoticeable.

An organic electroluminescence device according to another embodiment of the disclosure includes: a plurality of pixels each including an organic layer and a second electrode in this order on a first electrode having light reflectivity, and each configured to emit light of one wavelength out of two or more different wavelengths, the organic layer including an organic electroluminescence layer. Each of the pixels is subdivided into a plurality of light emission regions, and a formation pattern of the light emission regions has periodicity corresponding to an emission wavelength of the pixel.

In the organic electroluminescence device according to another embodiment of the disclosure, each of the pixels is subdivided into the plurality of light emission regions, and the formation pattern of the emission regions has periodicity corresponding to the emission wavelength of the pixel. Rainbow-like coloring caused by reflection of outside light may be seen due to a difference in diffraction pattern between wavelengths included in the outside light. However, the formation pattern of the emission regions of each of the pixels has periodicity corresponding to the wavelength, which makes it possible to make such coloring unnoticeable.

An organic electroluminescence device according to still another embodiment of the disclosure includes a plurality of pixels each including an organic layer and a second electrode in this order on first electrodes having light reflectivity, and each configured to emit light of one wavelength out of two or more different wavelengths, the organic layer including an organic electroluminescence layer, the first electrodes being formed for the respective pixels and each having a circular planar shape.

In the organic electroluminescence device according to still another embodiment of the disclosure, the first electrodes formed for the respective pixel each have a circular planar shape. Accordingly, outside light is less likely to be reflected to one direction (outside light is more likely to be reflected to all directions), as compared with a case in which the first electrodes each have a rectangular shape. Rainbow-like coloring caused by reflection of outside light may be seen due to a difference in diffraction pattern between wavelengths included in the outside light. However, reflection directions are dispersed by the circular shape, which makes such coloring unnoticeable.

According to the organic electroluminescence device and the electronic apparatus of the embodiments of the disclosure, the black matrix layer has the inclined surfaces inside the first apertures, and the inclination angles of the inclined surfaces are set, based on the emission wavelengths of the pixels, which makes it possible to the rainbow-like coloring caused by reflection of outside light unnoticeable. Accordingly, it is possible to suppress deterioration in visibility due to the reflection of outside light.

According to the organic electroluminescence device of another embodiment of the disclosure, each of the pixels is subdivided into the plurality of light emission regions, and the formation pattern of the emission regions has periodicity corresponding to the emission wavelength of the pixel, which makes it possible to rainbow-like coloring caused by reflection of outside light unnoticeable. Accordingly, it is possible to suppress deterioration in visibility due to the reflection of outside light.

According to the organic electroluminescence device of still another embodiment of the disclosure, the first electrodes formed for the respective pixels each have the circular planar shape, which makes it possible to rainbow-like coloring caused by reflection of outside light unnoticeable. Accordingly, it is possible to suppress deterioration in visibility due to the reflection of outside light.

It is to be noted that the above described contents are merely examples of the embodiments of the disclosure. Effects of the embodiments of the disclosure are not limited to effects described here, and may be different from the effects described here or may further include any other effect.

BRIEF DESCRIPTION OF DRAWINGS

FIG. 1 is a functional block diagram of an entire configuration of an organic electroluminescence device according to a first embodiment of the disclosure.

FIG. 2 is a circuit diagram of an example of a pixel circuit illustrated in FIG. 1.

FIG. 3 is a cross-sectional view of a configuration of the organic electroluminescence device illustrated in FIG. 1.

FIG. 4 is a schematic view for description of a difference in visibility between with and without reflection of outside light.

FIG. 5 is a schematic view for description of rainbow-like coloring caused by reflection of outside light.

FIG. 6 is a cross-sectional view of a configuration of an organic electroluminescence device according to a comparative example 1.

FIG. 7 is a diagram of a light application simulation result in the comparative example 1.

FIG. 8 is a diagram of a light application simulation result in an example 1.

FIG. 9 is a cross-sectional view of a configuration of an organic electroluminescence device according to a second embodiment of the disclosure.

FIG. 10 is a schematic plan view of a configuration of a first electrode illustrated in FIG. 9.

FIG. 11 is a schematic plan view of a configuration of a first electrode according to a comparative example 2.

FIG. 12 is a diagram of a light application simulation result in the comparative example 2.

FIG. 13 is a diagram of a light application simulation result in the example 2.

FIG. 14 is a cross-sectional view and a plan view, where (A) illustrates an organic EL element according to a comparative example 3, and (B) illustrates an organic EL element according to a modification example 1.

FIG. 15 is a characteristic diagram of reflectivity in an example 3 and the comparative example 3.

FIG. 16 is a cross-sectional view of a configuration of an organic EL element according to a modification example 2.

FIG. 17 is a schematic view for description of workings of the organic EL element illustrated in FIG. 16.

FIG. 18 is a characteristic diagram of external quantum efficiency in an example 4 and a comparative example 4.

FIG. 19 is a cross-sectional view of a configuration of an organic electroluminescence device according to a modification example 3.

FIG. 20 is a diagram of a light application simulation result in an example 5.

FIG. 21A is a plan view of a rectangular first electrode.

FIG. 21B is a diagram of a planar shape of a first electrode according to a modification example 4.

FIG. 22 is a diagram of a light application simulation result in a comparative example 6.

FIG. 23 is a diagram of a light application result in an example 6.

FIG. 24 is a cross-sectional view of a configuration of an organic EL element according to a modification example 5.

FIG. 25 is a schematic plan view of planar shapes of an aperture and a first electrode according to a modification example 6.

FIG. 26 is a cross-sectional view of an element configuration according to another modification example.

FIG. 27A is a perspective view of an appearance of an application example 1.

FIG. 27B is a perspective view of an appearance of the application example 1.

FIG. 28 is a perspective view of an appearance of an application example 2.

FIG. 29A is a perspective view of an appearance of an application example 3.

FIG. 29B is a perspective view of an appearance of the application example 3.

MODE FOR CARRYING OUT THE INVENTION

Some embodiments of the disclosure are described in detail below in the following order with reference to drawings.

1. First Embodiment (An example of an organic electroluminescence device in which an aperture of a black matrix layer has a predetermined inclined surface)

2. Second Embodiment (An example of an organic electroluminescence device in which a light emission aperture of one pixel is subdivided, and a pattern of the light emission aperture has periodicity)

3. Modification Example 1 (An example in a case in which a first electrode has a size equal to or smaller than the light emission aperture)

4. Modification Example 2 (An example in a case in which a reflector configuration is added)

5. Modification Example 3 (An example of another reflector configuration)

6. Modification Example 4 (An example in a case in which the first electrode has a circular planar shape)

7. Modification Example 5 (An example of another reflector configuration)

8. Modification Example 6 (An example in a case in which an aperture of an insulating film has a circular shape and the first electrode has a rectangular planar shape)

9. Application Examples (Examples of electronic apparatuses)

First Embodiment

[Configuration]

FIG. 1 illustrates an entire configuration of an organic electroluminescence device (an organic electroluminescence device 1) according to a first embodiment of the disclosure. The organic electroluminescence device 1 may be used as, for example, an organic EL television without limitation. The organic electroluminescence device 1 includes pixels 10R, 10G, and 10B in a display region 110A of a drive substrate 11. The pixels 10R, 10G, and 10B each include an organic EL element (an organic EL element 10) to be described later, and are two-dimensionally arranged in a matrix. A signal line drive circuit 120 and a scanning line drive circuit 130 serving as drivers for image display are provided around the display region 110A. Note that the pixels are arrayed on the drive substrate 11 along two directions, i.e., an X direction (for example, a horizontal direction of a display screen) and a Y direction (for example, a vertical direction of the display screen). The X direction and the Y direction are orthogonal to each other.

A pixel circuit 140 is provided in the display region 110A. The pixel circuit 140 includes the organic EL element 10 that configures the pixel 10R, 10G, or 10B. FIG. 2 illustrates an example of the pixel circuit 140. The pixel circuit 140 may be, for example, an active circuit. The pixel circuit 140 may include, for example, a driving transistor Tr1, a writing transistor Tr2, a capacitor (a retention capacitor) Cs, the pixel 10R (or the pixel 10G or the pixel 10B), and the organic EL element 10. The organic EL element 10 is coupled in series to the driving transistor Tr1 between a first power supply line (Vcc) and a second power supply line (GND). Each of the driving transistor Tr1 and the writing transistor Tr2 may be configured of a typical thin film transistor (TFT), and may have, for example, an inverted stagger configuration (a so-called bottom gate configuration) or a stagger configuration (a top gate configuration).

In the pixel circuit 140, a plurality of signal lines 120A are provided along a column direction, and a plurality of scanning lines 130A are provided along a row direction. An intersection of each signal line 120A and each scanning line 130A corresponds to one (one sub-pixel) of the pixels 10R, 10G, and 10B. Each of the signal lines 120A is coupled to the signal line drive circuit 120, and an image signal is supplied from the signal line drive circuit 120 to a source electrode of the writing transistor Tr2 through the signal line 120A. Each of the scanning lines 130A is coupled to the scanning line drive circuit 130, and a scanning signal is sequentially supplied from the scanning line drive circuit 130 to a gate electrode of the writing transistor Tr2 through the scanning line 130A.

The pixel 10R may be, for example, a pixel that emits red (R) light having a spectrum peak around 600 nm (light of an emission wavelength corresponding to red light). The pixel 10G may be, for example, a pixel that emits green (G) light having a spectrum peak around 530 nm (light of an emission wavelength corresponding to green light). The pixel 10B may be, for example, a pixel that emits blue (B) light having, for example, a spectrum peak around 450 nm (light of an emission wavelength corresponding to blue light). Three pixels 10R, 10G, and 10B (three sub-pixels) that are adjacent to one another configure one pixel. It is to be noted that three pixels of R, G, and B are exemplified here; however, a pixel that emits color light of white (W) or yellow (Y) may be further provided in addition to these pixels, and a combination of four pixels may configure one pixel. Sizes of the pixels 10R, 10G, and 10B may be, for example, but not particularly limited to, 50 µm.

FIG. 3 illustrates a cross-sectional configuration of the organic electroluminescence device 1. Note that FIG. 3 illustrates only a region corresponding to three pixels 10R, 10G, and 10B. In the organic electroluminescence device 1, for example, light may be extracted by a top emission scheme, and the organic EL element 10 may be formed in each of the pixels 10R, 10G, and 10B (in each of the pixels) on, for example, the drive substrate 11. The organic EL element 10 includes a first electrode 12, an organic layer 14, and a second electrode 15 in order from the drive substrate 11 side. The first electrode 12 is provided in each of the pixels, and an inter-pixel insulating film 13 is formed on the first electrodes 12 of all of the pixels. The inter-pixel insulating film 13 has an aperture H2 (a second aperture) that opposes each of the first electrodes 12. The organic layer 14 is formed on the first electrode 12 in the aperture H2. The second electrode 15 may be so formed over all of the pixels as to cover the inter-pixel insulating film 13 and the organic layer 14, for example.

A sealing substrate 20 is bonded to the second electrode 15 with a protective film 16 and a sealing resin layer 17 in between. A color filter layer 19 and a black matrix layer 18 are formed on one surface (a surface opposing the organic EL element 10) of the sealing substrate 20.

The drive substrate 11 may be configured of a TFT and a wiring layer that are formed on a substrate made of, for example, glass without limitation. A material of the substrate is not limited to glass, and quartz, metal foil, a resin film, or any other material may be used for the substrate.

The first electrode 12 is a reflective electrode having light reflectivity. In a case in which the first electrode 12 functions as an anode, the first electrode 12 may be desirably made of, for example, a simple substance or an alloy of a metal. Examples of the metal may include aluminum (Al), platinum (Pt), gold (Au), silver (Ag), chromium (Cr), tungsten (W), nickel (Ni), copper (Cu), iron (Fe), cobalt (Co), and tantalum (Ta). Examples of the alloy may include an Ag—Pd—Cu alloy and an Al—Nd alloy. The Ag—Pd—Cu alloy may include silver as a main component, 0.3 wt % to 1 wt % of palladium (Pd), and 0.3 wt % to 1 wt % of copper. Alternatively, the first electrode 12 may be a multilayer film including a metal film made of one of the metal elements and the alloys as mentioned above and a transparent conductive film made of ITO or any other transparent conductive material. The first electrode 12 may be desirably made of a material having a high hole injection property; however, even if the first electrode 12 is made of a material (such as aluminum (Al) and an alloy including aluminum) other than the material having a high hole injection property, providing an appropriate hole injection layer makes it possible to use the first electrode 12 as the anode. Examples of the material of the transparent conductive film may include an oxide of indium and tin (ITO), INZnO (Indium zinc oxide), and an alloy of zinc oxide (ZnO) and aluminum (Al). The first electrode 12 may have a thickness of 200 nm, for example.

The inter-pixel insulating film 13 is adapted to define (partition) a pixel aperture (a light emission region or a light emission aperture) and to electrically separate the first electrodes 12 from one another. The inter-pixel insulating film 13 may be made of, for example, a resin such as an acrylic resin and polyimide.

The organic layer 14 includes an organic electroluminescence layer that emits color light by occurrence of recombination of electrons and holes in response to application of an electric field. Here, the organic EL elements 10 each are a white light-emitting element. White light emitted from each of the organic EL elements 10 passes through the color filter layer 19 to be separated into color light of R, G, and B. Thus, the color light of R, G, and B are emitted. The organic layer 14 may include, for example, a white light-emitting layer that emits white light, and may be formed for each of the pixels 10R, 10G, and 10B (for each of the pixels), or may be formed over all of the pixels. The white light-emitting layer may have, for example, a configuration in which a red light-emitting layer, a green light-emitting layer, and a blue light-emitting layer are stacked, or a configuration in which a blue light-emitting layer and a yellow light-emitting layer are stacked. However, the configuration of the organic layer 14 is not limited thereto, and the light-emitting layer may have a different color for each of the pixels. More specifically, in the pixel 10R, the organic layer 14 may include a red light-emitting layer. In the pixel 10G, the organic layer 14 may include a green light-emitting layer. In the pixel 10B, the organic layer 14 may include a blue light-emitting layer. Moreover, the organic layer 14 may further include, for example, a hole injection layer, a hole transport layer, and an electron transport layer in addition to the organic electroluminescence layer. Further, an electron injection layer or any other layer may be formed between the organic layer 14 and the second electrode 15. The organic layer 14 may have a thickness of about 250 nm, for example.

The second electrode 15 may be configured of a transparent conductive film made of a conductive material having a moderate work function and light transparency. Examples of the conductive material may include ITO (indium tin oxide) and IZO (indium zinc oxide). Another example of the material of the second electrode 18 may be an alloy of magnesium and silver (MgAg alloy). The second electrode 15 may have a thickness of about 200 nm, for example.

The protective film 16 may be made of, for example, silicon nitride (SiN), and may have a thickness of about 1.5 μm, for example. The sealing resin layer 17 may be made of, for example, an epoxy resin, and may have a thickness of about 4 μm, for example.

The black matrix layer 18 is formed over all of the pixels on light emission side of the second electrode 15. The black matrix layer 18 has an aperture H1 (a first aperture) for each of the pixels. In other words, the black matrix layer 18 is formed along a region between pixels, and may have a lattice pattern as a whole. The black matrix layer 18 may be made of, for example, a resin or a metal. A specific configuration of the black matrix layer 18 will be described later.

The color filter layer 19 is provided adjacent to a surface t2 on light emission side of the black matrix layer 18. The color filter layer 19 includes one of a red filter layer 19R, a green filter layer 19G, and a blue filter layer 19B. Each of the red filter layer 19R, the green filter layer 19G, and the blue filter layer 19B opposes corresponding one of the apertures H1 of the black matrix layer 18. The red filter layer 19R, the green filter layer 19G, and the blue filter layer 19B are so formed as to respectively oppose the aperture H1 of the pixel 10R, the aperture H1 of the pixel 10G, and the aperture of the pixel 10B. The red filter layer 19R includes a pigment that allows red light to pass therethrough and absorbs light of other wavelengths. The green filter layer 19G includes a pigment that allows green light to pass therethrough and absorbs light of other wavelengths. The blue filter layer 19B includes a pigment that allows blue light to pass therethrough and absorbs light of other wavelengths.

The sealing substrate 20 may be made of a material transparent to light emitted from the pixels 10R, 10G, and 10B, such as glass.

(Specific Configuration of Black Matrix Layer 18)

In the embodiment, the black matrix layer 18 has an inclined surface (inclined surfaces S1 to S3) inside each of the apertures H1. In other words, an edge of each of the apertures H1 is inclined, or the black matrix layer 18 has a tapered cross-sectional shape in a plane orthogonal to a display screen. These inclined surfaces S1 to S3 each are inclined in a direction in which the aperture H1 is narrowed from a surface t1 on the organic EL element 10 side to the surface t2 on the light emission side (on outside light entry side) of the black matrix layer 18. It is to be noted that a method of forming such inclined surfaces S1 to S3 is not specifically limited; however, the inclined surfaces S1 to S3 may be formed as follows. When the black matrix layer 18 is patterned to form the apertures H1, a pattern of inclined (tapered) surfaces similar to the inclined surfaces S1 to S3 is formed in a photoresist, and etching is performed. This makes it possible to transfer the pattern of the photoresist to the black matrix layer 18.

Inclination angles (inclination angles $\theta 1$ to $\theta 3$) of the inclined surfaces S1 to S3 are set, based on wavelengths of color light emitted from the pixels 10R, 10G, and 10B (emission wavelengths of the pixels 10R, 10G, and 10B). In other words, the inclination angles $\theta 1$ to $\theta 3$ are set, based on transmission wavelengths of the color filter layers 19 in respective pixels. More specifically, the inclination angles $\theta 1$ to $\theta 3$ are set to be larger in a pixel that emits light of a shorter wavelength. Accordingly, in the pixel that emits light of a shorter wavelength, intensity at a pixel end of a reflection intensity distribution is varied more gently. In a case with the three-pixel configuration including three pixels of R, G, and B as with the embodiment, blue light has the shortest wavelength, and wavelengths of green light and red light increase in this order. Accordingly, the inclination angles $\theta 1$ to $\theta 3$ are so set as to satisfy $\theta 1 \leq \theta 2 \leq \theta 3$. The reflection intensity distribution is formed, based on magnitudes of the inclination angles $\theta 1$ to $\theta 3$, and it is therefore possible for the pixels 10R, 10G, and 10B to have different reflection intensity distributions. More specifically, reflection intensity of each of the pixels 10R, 10G, and 10B has a distribution in which the reflection intensity has a peak around a pixel center and decreases toward the pixel end; however, intensity variation (profile shape) at the pixel end of the reflection intensity distribution is different in each of the pixels 10R, 10G, and 10B. In this case, intensity at the pixel end in the reflection intensity distribution of the pixel 10R that emits red light is abruptly varied (the intensity is abruptly decreased at the pixel end), whereas intensity at the pixel end in the reflection intensity distribution of the pixel 10G that emits green light is varied more gently than that in the pixel 10R. Intensity at the pixel end in the reflection intensity distribution of the pixel 10B that emits blue light of the shortest wavelength is varied more gently than that in the pixel 10G.

The inclination angles $\theta 1$ to $\theta 3$ each may not necessarily be equal to or larger than 0°, and one of the inclination angles $\theta 1$ to $\theta 3$ may be set to be larger than 0° (the inclination angles $\theta 1$ to $\theta 3$ may include an inclination angle set to 0°). In an example of FIG. 3, the inclination angle $\theta 1$ in the pixel 10R that emits red light of the longest wavelength is 0°. In the pixels 10G and 10B, the inclination angles $\theta 2$ and $\theta 3$ each are so set as to be larger than 0° and satisfy $\theta 2 < \theta 3$. In this example, the inclination angles $\theta 1$ to $\theta 3$ are set so that the reflection intensity distributions of green light and blue light follow the reflection intensity distribution of red light. However, the inclination angles $\theta 1$ to $\theta 3$ are not limited thereto. Even in the pixel 10R, the inclination angle $\theta 1$ may be set to be larger than 0°. Moreover, only the inclination angle $\theta 3$ in the pixel 10B that emits light of the shortest wavelength may be so set as to be larger than 0°, and in the pixels 10G and 10R, the inclination angles θ1 and θ2 may be so set as to be θ1=θ2=0°. However, the inclination angles θ1 to θ3 may be desirably set, based on the emission wavelengths, so as to satisfy θ1<θ2<θ3 as with the embodiment.

In the embodiment, each of the predetermined inclined surfaces S1 to S3 is provided in corresponding one of the apertures H1 of the black matrix layer 18 to form the reflection intensity distribution for each pixel; however, the reflection intensity distribution may be formed by any other method. For example, transmittance of the sealing resin layer 17, reflectivity of the first electrode 12, or transmittance (absorptance) of the color filter layer 19 (the red filter layer 19R, the green filter layer 19G, and the blue filter layer 19B) may be so designed as to be varied in each of the pixels, which makes it possible to form the reflection intensity distribution. As one of the other methods, for example, a concentration of each of the pigments of the red filter layer 19R, the green filter layer 19G, and the blue filter layer 19B in the color filter layer 19 may be so adjusted as to increase toward the pixel end, thereby decreasing a gradient of variation of the concentration (making the gradient of variation of the concentration gentler) in order of B, G, and R. Alternatively, for example, the transmittance of the sealing resin layer 17 may be so adjusted as to decrease toward the pixel end, thereby decreasing a gradient of variation of the transmittance (making the gradient of variation of the transmittance gentler) in order of the B, G, and R.

Accordingly, it is possible for each pixel to have a different reflection intensity distribution by forming a transmittance distribution of the sealing resin layer 17, a reflectivity distribution of the first electrode 12, or a transmittance distribution of the color filter layer 19, based on the emission wavelengths. This makes it possible to achieve effects similar to those in a case in which the inclined surfaces S1 to S3 are provided. Moreover, setting of one or more of the transmittance distribution of the sealing resin layer 17, the reflectivity distribution of the first electrode 12, and the transmittance distribution of the color filter layer 19, and setting of the inclination angles θ1 to θ3 of the black matrix layer 19 may be used together to form a reflection intensity distribution as described above.

[Workings and Effects]

In the organic electroluminescence device 1 according to the embodiment, when a drive current is supplied to the organic layer 14 through the first electrode 12 and the second electrode 15, color light (for example, white light) generated in the organic electroluminescence element 10 passes through the second electrode 15, the protective film 16, the sealing resin layer 17, the color filter layer 19, and the sealing substrate 20 to be extracted. Thus, an image is displayed.

The organic electroluminescence device 1 may be used under irradiation with intense light in some cases. FIGS. 4 and 5 schematically illustrate an influence of reflection of outside light on visibility. When an organic EL panel (an organic EL panel 210) including the organic EL element 10 as described above is irradiated with outside light L, a black display region P1 looks black in a case with no reflection of outside light (a left diagram of FIG. 4), whereas the black display region P1 looks lightly colored (looks whitish) in a case with large reflection of outside light (a right diagram of FIG. 4). It is desirable to reduce reflectivity caused by such reflection of outside light.

In contrast, as illustrated in FIG. 5, in a case in which the organic EL panel 210 is irradiated with the outside light L, rainbow-like coloring may be seen due to reflection of outside light, since diffraction patterns of respective wavelengths (Lr, Lg, and Lb) included in outside light are different from one another. Such coloring is easily seen by bringing pixel order close to wavelength order, i.e., by increasing pixel definition. In the embodiment, the black matrix layer 18 has the inclined surfaces S1 to S3 inside the apertures H1, and the inclination angles θ1 to θ3 are set, based on the emission wavelengths (R, G, and B) of the pixels. It is therefore possible for each of the pixels (each of the wavelengths) to have a different reflection intensity distribution. In other words, it is possible to design diffraction patterns for respective wavelengths to be identical to one another (follow the diffraction pattern of red light in this case), which makes rainbow-like coloring unnoticeable.

FIG. 6 illustrates a cross-sectional configuration of an organic electroluminescence device (an organic electroluminescence device 100) according to a comparative example (a comparative example 1) of the embodiment. The organic electroluminescence device 100 includes a first electrode 102, an inter-pixel insulating film 103, an organic layer 104, a protective film 105, a sealing resin layer 106, a black matrix layer 107, a color filter layer 108, and a sealing substrate 109 on a drive substrate 101 as with the embodiment. However, in the black matrix layer 107, a surface inside an aperture H100 is not inclined in any of the pixels.

FIG. 7 illustrates a simulation result of application of light (white light having a circular cross-sectional shape) to a central region of a panel including the organic electroluminescence device 100 of the comparative example 1. Note that a right diagram of FIG. 7 is an enlarged view of a region around a center of a left diagram. As can be seen from the simulation result, in the comparative example 1, reflected light extends crosswise from the central region of the panel, and a rainbow-like color is seen.

FIG. 8 illustrates a simulation result of application of white light to a central region of a panel including the organic electroluminescence device 1 according to the embodiment as an example 1, as with the foregoing comparative example 1. Note that a right diagram of FIG. 8 is an enlarged view of a region around a center of a left diagram. As can be seen from FIG. 8, the color seen in FIG. 7 disappears, and black, white, or gray is seen. Namely, rainbow-like coloring is reduced.

As described above, in the embodiment, the black matrix layer 18 has the inclined surfaces S1 to S3 inside the apertures H1, and the inclination angles θ1 to θ3 are set, based on the emission wavelengths (R, G, and B) of the pixels 10R, 10G, and 10B. This makes it possible to make rainbow-like coloring caused by reflection of outside light unnoticeable. Accordingly, it is possible to suppress deterioration in visibility due to reflection of outside light. It is possible to maintain favorable visibility even under irradiation with intense light.

Next, description is given of embodiments other than the foregoing first embodiment and modification examples. It is to be noted that substantially same components as those in the foregoing first embodiment are denoted with same reference numerals, and any redundant description thereof is omitted.

Second Embodiment

FIG. 9 illustrates a cross-sectional configuration of an organic electroluminescence device (an organic electroluminescence device 2) according to a second embodiment. The organic electroluminescence device 2 may include, for example, a plurality of pixels 10R, 10G, and 10B each including the organic EL element 10 on the drive substrate 11, as with the first embodiment. The pixels 10R, 10G, and 10B are arranged in a matrix. Moreover, each of the organic EL elements 10 includes a first electrode (a first electrode 12A, 12B, or 12C) provided for each of the pixels, the inter-pixel insulating film 13, the organic layer 14, and the second electrode 15. The inter-pixel insulating film 13 has the aperture H2 that opposes the first electrode 12A (or the first electrode 12B or 12C). The sealing substrate 20 is provided on the second electrodes 15 of the organic EL elements 10 with the protective film 16, the sealing resin layer 17, a black matrix layer (a black matrix layer 18A), and the color filter layer 19 in between. The black matrix layer 18A is made of a material similar to the material of the black matrix layer 18 in the foregoing first embodiment. The black matrix layer 18A is so formed as to have an aperture H1$a$ that opposes each of the pixels 10R, 10G, and 10B, and to have a lattice pattern as a whole.

However, in the embodiment, unlike the foregoing first embodiment, the aperture H1$a$ of the black matrix layer 18A does not have an inclined surface. In the embodiment, each of the organic EL elements 10 (each of the pixels 10R, 10G, and 10B) further includes a plurality of light emission regions (light emission apertures) (each of the organic EL elements 10 is divided into a plurality of light emission regions). A formation pattern of the light emission regions has periodicity corresponding to each of the emission wavelengths (R, G, and B) of the pixels 10R, 10G, and 10B. In this case, each of the first electrodes 12A to 12C is subdivided in the aperture H2 to form a plurality of light emission regions in accordance with the formation pattern.

FIG. 10 schematically illustrates a planar configuration of the first electrodes 12A to 12C. Each of the first electrodes 12A, 12B, and 12C is configured of a plurality of sub-electrodes (sub-electrodes 12$a$1, 12$b$1, and 12$c$1). The sub-electrodes are arranged in a dot pattern (discretely provided). The first electrode 12A, the first electrode 12B, and the first electrode 12C are respectively disposed in the pixel 10B, the pixel 10G, and the pixel 10R. As materials of the first electrodes 12A to 12C, a material similar to that of the first electrode 12 in the foregoing first embodiment may be used. In the first electrode 12A, a plurality of sub-electrodes 12$a$1 are discretely provided at equal intervals (with a pitch d1). In the first electrode 12B, a plurality of sub-electrodes 12$b$1 are discretely provided at equal intervals (with a pitch d2). In the first electrode 12C, a plurality of sub-electrodes 12$c$1 are discretely provided at equal intervals (with a pitch d3). A planar shape of each of the sub-electrodes 12$a$1, 12$b$1, and 12$c$1 may be, for example, a circular shape, but may be any other shape (for example, a square shape or a polygonal shape).

In the first electrodes 12A, 12B, and 12C, the sub-electrodes 12$a$1, 12$b$1, and 12$c$1 are so arranged as to have different periodicity. More specifically, the pitches d1, d2, and d3 of the sub-electrodes 12$a$1, 12$b$1, and 12$c$1 are so designed as to be smaller in a pixel that emits light of a shorter wavelength. More specifically, the pitches d1, d2, and d3 are so designed as to be linearly varied with the emission wavelengths. In a case with a three-pixel configuration including three pixels of R, G, and B as with the embodiment, blue light has the shortest wavelength, and wavelengths of green light and red light increase in this order. Accordingly, the pitch d1 of the sub-electrodes 12$a$1 in the first electrode 12A of the pixel 10B is the smallest. The pitch d2 of the sub-electrodes 12$b$1 in the first electrode 12B of the pixel 10G is so designed as to be larger than the pitch d1, and the pitch d3 of the sub-electrodes 12$c$1 in the first electrode 12C of the pixel 10R is so designed as to be larger than the pitch d2. In other words, the sub-electrodes 12$a$1, 12$b$1, and 12$c$1 are so arranged as to have periodicity that causes the pitches d1, d2, and d3 of the sub-electrodes 12$a$1, 12$b$1, and 12$c$1 to satisfy d1≤d2≤d3. As an example, since the transmittance peaks of the blue filter layer 19B, the green filter layer 19G, and the red filter layer 19R are respectively about 450 nm, about 530 nm, and about 600 nm, it is possible to design the pitches d1, d2, and d3 so as to satisfy d1:d2:d3=1:1.18:1.33. It is to be noted that the sub-electrodes 12$a$1, 12$b$1, and 12$c$1 have different sizes (areas) in order to secure a substantially equal aperture ratio (aperture area) in the pixels 10R, 10G, and 10B.

In the organic electroluminescence device 2 according to the embodiment, an image is displayed as with the foregoing first embodiment. Moreover, rainbow-like coloring may be seen under irradiation with intense light; however, in the embodiment, each of the pixels is subdivided into a plurality of light emission regions, and the formation pattern of the light emission regions has periodicity corresponding to each of the emission wavelengths (R, G, and B) of the pixels 10R, 10G, and 10B. More specifically, the sub-electrodes 12$a$1 to 12$c$1 of the first electrodes 12A to 12C are so arranged as to allow the pitches d1, d2, and d3 to satisfy d1≤d2≤d3.

FIG. 11 illustrates a planar configuration of first electrodes (first electrodes 12D) according to a comparative example (a comparative example 2) of the embodiment. In the comparative example 2, each of the first electrodes 12D provided for the respective pixels 10R, 10G, and 10B is configured of a plurality of sub-electrodes 12$d$1 that are arranged with same periodicity. In each of the first electrodes 12D, the sub-electrodes 12$d$1 are arranged at equal intervals (with a pitch d).

FIG. 12 illustrates a simulation result of application of light (white light having a circular cross-sectional shape) to a central region of a panel including the first electrodes 12D of the comparative example 2. Moreover, FIG. 13 illustrates a simulation result of application of white light similar to the above white light to a central region of a panel including the first electrodes 12A to 12C of the embodiment as an example 2. In FIG. 12, rainbow-like coloring is seen. In contrast, as can be seen from FIG. 13, the color seen in FIG. 12 disappears, and black, white, or gray is seen. Namely, rainbow-like coloring is reduced.

As described above, in the embodiment, the formation pattern of the light emission regions of each pixel has periodicity corresponding to the wavelength, which makes it possible to make rainbow-like coloring unnoticeable. It is therefore possible to achieve effects similar to those in the foregoing first embodiment.

Modification Example 1

FIG. 14 is a diagram for description of an organic EL element (an organic EL element 10A) according to a modification example (a modification example 1) of the foregoing first and second embodiments. (A) of FIG. 14 illustrates an element configuration (a configuration corresponding to the organic EL element 10 of the foregoing first embodiment) according to a comparative example (a comparative example 3). A right diagram illustrates a planar shape of the first electrode 12 in a left diagram. (B) of FIG. 14 illustrates a configuration of the organic EL element 10A, and a right diagram illustrates a planar configuration of a first electrode (the first electrode 12D) in a left diagram. The configuration of the first electrode 12D in the organic EL element 10A is different from that in the organic EL element 10 according to the foregoing first embodiment, and other configurations of the organic EL element 10A is similar to the foregoing organic EL element 10. It is to be noted that the first electrode 12D is formed for each of the pixels, and a material of the first electrode 12D is similar to that of the first electrode 12 in the foregoing first embodiment.

In the modification example, the size of the first electrode 12D is substantially equal to or smaller than a size of the aperture H2 of the inter-pixel insulating film 13. The size of the first electrode 12D is designed to be slightly smaller than that of the first electrode 12 by a width with consideration of a manufacturing margin (a degree of freedom of alignment). A width d5 in one direction of the first electrode 12D is designed to be smaller than a width d4 of the first electrode 12.

As described above, the size of the first electrode 12D is designed to be substantially equal to or smaller than that of the aperture H2, which makes it possible to reduce outside light reflectivity. In this case, the first electrode 12D is made of a material having high reflectivity; therefore, reflectivity of visible light is extremely high. Accordingly, if possible, it may be desirable not to form an electrode pattern in a region that does not emit light, i.e., a region that is not exposed from the aperture H2 of the inter-pixel insulating film 13. Designing the size of the first electrode 12D to be substantially equal to or smaller than the size of the aperture H2 as with the modification example makes it possible to form the first electrode 12D having a minimum size corresponding to the light emission aperture and minimize a region contributing to reflection of outside light.

FIG. 15 illustrates reflectivity in an element configuration using the first electrode 12 in the comparative example 3 and reflectivity (normalized reflectivity) in an element configuration using the first electrode 12D in the modification example as an example 3. In the example 3, as compared with the comparative example 3, it is possible to reduce an absolute reflection amount by about 30%. Accordingly, application of the configuration of the organic EL element 10A of the modification example to the organic electroluminescence devices according to the foregoing first and second embodiments makes it possible to reduce the outside light reflectivity (reflection amount) while suppressing rainbow-like coloring caused by reflection of outside light, thereby maintaining more favorable visibility.

Modification Example 2

FIG. 16 illustrates a configuration of an organic EL element (an organic EL element 10B) according to a modification example (a modification example 2) of the foregoing first and second embodiments. The organic EL element 10B of the modification example has a reflector configuration (a so-called anode reflector) in a side surface (beside the light emission aperture) of an aperture (an aperture H2a) of an insulating film 13A. The insulating film 13A corresponds to the inter-pixel insulating film 13 in the foregoing first embodiment. In the modification example, a first electrode 12E is configured of a plurality of sub-electrodes 12e1 as with the foregoing second embodiment. The sub-electrodes 12e1 are arranged in a dot pattern (discretely provided). Moreover, the insulating film 13A has a plurality of projections 13a1 in a cross-sectional shape in the aperture H2a serving as a light emission aperture of each pixel. In other words, the insulating film 13A includes a plurality of sub-apertures H2a1 in the aperture H2a, and each of the sub-apertures H2a1 is disposed to oppose corresponding one of the sub-electrodes 12e1. In each of the sub-apertures H2a1, the organic layer 14 is exposed, and is in contact with the second electrode 15. The protective film 16 is formed along the shapes of the plurality of projections 13a1. Note that the first electrode 12E is formed for each of the pixels, and a material of the first electrode 12E is similar to that of the first electrode 12 in the foregoing first embodiment.

As described above, the organic EL element 10B may include a so-called anode reflector. This makes it possible to efficiently extract light emitted from the organic layer 14 as illustrated in FIG. 17. In other words, this makes it possible to improve external quantum efficiency. As compared with an element configuration without the reflector configuration (a comparative example 4), in an element configuration in the modification example (an example 4), for example, it is possible to improve external quantum efficiency by about 2.5 times as illustrated in FIG. 18. In addition, the light emission aperture is subdivided into dots by the projections 13a1, which makes it possible to suppress rainbow-like coloring caused by reflection of outside light, as with the foregoing second embodiment. More specifically, for example, the arrangement pitch of the sub-electrodes 12e1 is designed, based on the emission wavelength of the pixel, which makes it possible for each pixel to have different periodicity of the formation pattern of the light emission region even in the modification example. Moreover, application of the configuration of the organic EL element 10B in the modification example to the organic electroluminescence devices according to the foregoing first and second embodiments makes it possible to improve external quantum efficiency while suppressing rainbow-like coloring caused by reflection of outside light, thereby maintaining more favorable visibility.

Modification Example 3

FIG. 19 illustrates a configuration of an organic electroluminescence device according to a modification example (a modification example 3) of the foregoing first and second embodiments. In the foregoing modification example 2, the light emission region in the pixel is subdivided to form the reflector configuration. However, as with the modification example, a reflector configuration may be formed on a side surface of one light emission aperture (an aperture H2b) in an inter-pixel insulating film 13B. In this modification example, the black matrix layer 18 according to the foregoing first embodiment may be provided, for example.

As described above, the reflector configuration may be provided on the side surface of one aperture H2b, and even in this case, it is possible to improve external quantum efficiency as with the foregoing modification example 2. Moreover, the aperture H1 of the black matrix layer 18 may have a predetermined inclined surface as with the foregoing first embodiment, which makes it possible to make rainbow-like coloring unnoticeable. It is therefore possible to further improve external quantum efficiency while achieving effects similar to those in the foregoing first embodiment.

FIG. 20 illustrates a simulation result of application of light (white light having a circular cross-sectional shape) to a central region of a panel having the black matrix layer 18 and the reflector configuration as mentioned above as an example 5. Although crosswise reflection of outside light is seen, coloring is slight. Moreover, it is possible to achieve external quantum efficiency that is about 2.5 times as high as that in the foregoing first embodiment.

Modification Example 4

FIGS. 21A and 21B are plan views for description of the configuration of a first electrode according to a modification example (a modification example 3) of the foregoing first and second embodiments. FIG. 21A illustrates a configuration of a first electrode having a typical rectangular planar shape (an electrode corresponding to the first electrode 12 in the foregoing first embodiment) as a comparative example (a comparative example 6). FIG. 21B illustrates a configuration of a first electrode 12F in the modification example. Note that the first electrode 12F is formed for each of the pixels, and a material of the first electrode 12D is similar to that of the first electrode 12 in the foregoing first embodiment. Moreover, the "rectangular shape" is not limited to a precise rectangular shape, and may be a substantially rectangular shape. Examples of the rectangular shape may include a rectangular shape having a blunt corner caused by a manufacturing process, and a side or a corner of the rectangular shape may be rounded.

As illustrated in FIG. 21B, the planar shape of the first electrode 12F may be a circular shape. A diameter of the first electrode 12F may be about 35 µm with respect to a pixel size of 50 µm, for example. Reflection directions are dispersed by such a circular shape, which makes rainbow-like coloring unnoticeable. Accordingly, it is possible to achieve effects similar to those in the foregoing first embodiment. Moreover, in a case in which the first electrode 12F has a circular shape as described above, the aperture shape of the aperture H2 of the inter-pixel insulating film 13 may be desirably a circular shape. Further, the size of the first electrode 12F may be desirably equal to or smaller than the size of the aperture H2, which makes it possible to achieve effects similar to those in the foregoing modification example 1.

FIG. 22 illustrates a simulation result of application of light (white light having a circular cross-sectional shape) to a central region of a panel including the first electrode 12 having a rectangular shape in the comparative example 6. Moreover, FIG. 23 illustrates a simulation result of application of white light similar to the above white light to a central region of a panel including the first electrode 12F having a circular shape in the modification example as an example 6. In FIG. 22, crosswise coloring is seen. As can be seen from FIG. 23, outside light is not reflected crosswise, and coloring is unnoticeable.

Modification Example 5

FIG. 24 illustrates a cross-sectional configuration of an organic EL element (an organic EL element 10C) according to a modification example (a modification example 5) of the foregoing first and second embodiments. In an organic EL element having the anode reflector configuration of the foregoing modification example 2, the first electrode 12E is subdivided into dots. However, as with the modification example, using an opaque resin layer 13C makes it possible to achieve substantially similar effects. More specifically, the organic EL element 10C has the opaque resin layer 13C including a plurality of projections 13a1 in the aperture H2a corresponding to one first electrode 12. The second electrode 15 is so provided as to cover the opaque resin layer 13C. The light emission aperture may be subdivided into dots with use of the opaque resin layer 13C as with the modification example.

Modification Example 6

FIG. 25 is a schematic view for description of an element configuration according to a modification example (a modification example 5) of the foregoing first and second embodiments. The planar shape of the aperture H2 of the inter-pixel insulating film 13 may be a circular shape, and the planar shape of the first electrode 12 may be a rectangular shape, as with the modification example. At this occasion, the inter-pixel insulating film 13 may be desirably made of an opaque resin.

In the foregoing embodiments and modification examples, a configuration is illustrated in which the color filter layer 19 and the black matrix layer 18 (or 18A) are stacked in order from the sealing substrate 20 side. Alternatively, as illustrated in FIG. 26, as a BM/CF layer 18B, the red filter layer 19R, the green filter layer 19G, or the blue filter layer 19B may be formed in the aperture H1 of the black matrix layer.

Application Examples

In the following, description is given of application examples of the organic electroluminescence devices described in the foregoing embodiments and modification examples. The organic electroluminescence devices according to the foregoing embodiments are applicable to display devices of electronic apparatuses, in any fields, that display an image signal inputted from outside or an image signal produced inside as an image or a picture, such as televisions, digital still cameras, notebook personal computers, mobile terminal devices such as mobile phones, and video cameras. In particular, the organic electroluminescence devices are suitable for small- and middle-sized mobile displays. Examples of such displays are as follows.

FIGS. 27A and 27B illustrate an appearance of a smartphone 220. The smartphone 220 may include, for example, a display section 221 and an operation section 222 on front side and a camera 223 on rear side. The display section 221 includes the organic electroluminescence device according to any of the foregoing embodiments and modification examples.

FIG. 28 illustrates an appearance of a tablet personal computer 240. The tablet personal computer 240 may include, for example, a touch panel section 241 and a housing 242. The touch panel section 241 includes the organic electroluminescence device according to any of the foregoing embodiments and modification examples.

FIGS. 29A and 29B illustrate an appearance of a mobile phone 290. The mobile phone 290 may have a configuration in which, for example, a top-side housing 291 and a bottom-side housing 292 are connected together through a connection section (hinge section) 293. The mobile phone 290 may include a display 294, a sub-display 295, a picture light 296, and a camera 297. The display 294 or the sub-display 295 is configured of the organic electroluminescence device according to any of the foregoing embodiments and modification examples.

Although description has been made by giving the example embodiments and the examples as mentioned above, the contents of the disclosure are not limited to the above-mentioned example embodiments and examples and may be modified in a variety of ways. For example, in the foregoing embodiments and examples, a case in which one pixel is configured of three sub-pixels of R, G, and B is exemplified; however, the pixel configuration in the disclosure is not limited thereto. Examples of the configuration of one pixel may include a four-pixel configuration in which one pixel is configured of pixels of R, G, B, and W (white), and a four-pixel configuration in which one pixel is configured of four pixels of R, G, B, and Y (yellow). In these cases, design change corresponding to the wavelength as mentioned above (such as the inclined surface of the black matrix layer or periodicity of the light emission region) is performed in three pixels of R, G, and B of the four pixels, which makes it possible to improve visibility. Alternatively, in a case in which the design change mentioned above is performed on the pixel of W (or the pixel of Y), for example, the pixel of W (or the pixel of Y) may be designed in a similar fashion to that of the pixel of G, for example.

Moreover, in the foregoing embodiments and examples, an element configuration that makes it possible to separate white light emitted from the organic electroluminescence element into colors with use of the color filter is exemplified; however, the disclosure is applicable to an element configuration without using the color filter.

Further, in the foregoing embodiments and examples, a top emission organic electroluminescence device is exemplified; however, the disclosure is applicable to a bottom emission organic electroluminescence device as well.

In addition thereto, the material and thickness of each layer, the method and conditions of forming each layer are not limited to those described in the foregoing embodiments and examples, and each layer may be made of any other material with any other thickness by any other method under any other conditions.

Further, in the foregoing embodiments, the active matrix display device is described; however, the disclosure is applicable to a passive matrix display device. Furthermore, a configuration of a pixel drive circuit for active matrix drive is not limited to that described in the foregoing embodiments, and may further include a capacitor or a transistor, if necessary. In this case, a necessary drive circuit may be included in addition to the signal line drive circuit 120 and the scanning line drive circuit 130 mentioned above in accordance with a modification of the pixel drive circuit. Further, the effects described in the foregoing embodiments and examples are merely examples, and effects achieved by the disclosure may be other effects or may further include other effects.

It is to be noted that the disclosure may include the following configurations.

(1) An organic electroluminescence device including:
a plurality of pixels each including an organic layer and a second electrode in this order on a first electrode having light reflectivity, and each configured to emit light of one wavelength out of two or more different wavelengths, the organic layer including an organic electroluminescence layer; and
a black matrix layer provided on light emission side of the second electrode, and having first apertures for the respective pixels, the black matrix layer having inclined surfaces inside the respective first apertures, and inclination angles of the inclined surfaces being set, based on emission wavelengths of the pixels.

(2) The organic electroluminescence device according to (1), wherein the inclination angles of the inclined surfaces in a pixel emitting light of a shorter wavelength of the pixels is set to be larger.

(3) The organic electroluminescence device according to (1) or (2), wherein a reflectivity distribution in the first electrode of each of the pixels is set, based on the emission wavelength of the pixel.

(4) The organic electroluminescence device according to any one of (1) to (3), wherein
the pixels are sealed between a first substrate and a second substrate, and a resin layer is provided between the pixels and the second substrate, and
a transmittance distribution in the resin layer in each of the pixels is set, based on the emission wavelength of the pixel.

(5) The organic electroluminescence device according to any one of (1) to (4), further including one or more of color filters each of which is formed corresponding to a selective first aperture of the first apertures of the black matrix layer,
wherein a transmittance distribution in the color filter of each of the pixels is set, based on the emission wavelength of the pixel.

(6) The organic electroluminescence device according to any one of (1) to (5), wherein, in a pixel emitting light of a shorter wavelength out of the pixels, intensity at a pixel end of a reflection intensity distribution is set to be varied more gently.

(7) The organic electroluminescence device according to any one of (1) to (6), further including an insulating film,
wherein the first electrode comprises a plurality of first electrodes formed for the respective pixels,
the insulating film has second apertures that oppose the respective first electrodes, and
a size of each of the first electrodes is equal to or smaller than a size of each of the second apertures.

(8) The organic electroluminescence device according to any one of (1) to (7), further including an insulating film,
wherein the first electrode comprises a plurality of first electrodes formed for the respective pixels,
the insulating film has second apertures that oppose the respective first electrodes, and
a reflector configuration is provided on a side surface of each of the second apertures.

(9) The organic electroluminescence device according to (8), wherein each of the first electrodes is configured of a plurality of sub-pixels that are discretely provided

(10) The organic electroluminescence device according to any one of (1) to (9), wherein
the first electrode comprises first electrodes formed for the respective pixels, and
each of the first electrodes has a circular planar shape.

(11) The organic electroluminescence device according to any one of (1) to (10), wherein the pixels include a pixel that emits one of red light, green light, and blue light.

(12) The organic electroluminescence device according to (11), wherein the plurality of pixels further include a pixel that emits white light.

(13) An organic electroluminescence device including a plurality of pixels each including an organic layer and a second electrode in this order on a first electrode having light reflectivity, and each configured to emit light of one wavelength out of two or more different wavelengths, the organic layer including an organic electroluminescence layer,
wherein each of the pixels is subdivided into a plurality of light emission regions, and a formation pattern of the light emission regions has periodicity corresponding to an emission wavelength of the pixel.

(14) The organic electroluminescence device according to (13), wherein
the first electrode comprises first electrodes formed for the respective pixels,
each of the first electrodes are configured of a plurality of sub-electrodes discretely provided, and
the light emission regions are formed in each of the pixels in accordance with a formation pattern of the sub-electrodes.

(15) The organic electroluminescence device according to (14), wherein an arrangement pitch of the sub-electrodes is set to be smaller in a pixel that emits light of a shorter wavelength of the pixels.

(16) The organic electroluminescence device according to any one of (13) to (15), further comprising an insulating film,
wherein the first electrode comprises a plurality of first electrodes formed for the respective pixels,
the insulating film has second apertures that oppose the respective first electrodes, and
a size of each of the first electrodes is equal to or smaller than a size of each of the second apertures.

(17) The organic electroluminescence device according to any one of (13) to (15), further including an insulating film,
wherein the first electrode comprises a plurality of first electrodes formed for the respective pixels,
the insulating film has second apertures that oppose the respective first electrodes, and
a reflector configuration is provided on a side surface of each of the second apertures.

(18) An organic electroluminescence device including a plurality of pixels each including an organic layer and a second electrode in this order on first electrodes having light reflectivity, and each configured to emit light of one wavelength out of two or more different wavelengths, the organic layer including an organic electroluminescence layer, the first electrodes being formed for the respective pixels and each having a circular planar shape.

(19) The organic electroluminescence device according to (18), further comprising an insulating film having second apertures that oppose the respective first electrodes and each having a circular shape.

(20) An electronic apparatus provided with an organic electroluminescence device, the organic electroluminescence device including:
a plurality of pixels each including an organic layer and a second electrode in this order on a first electrode having light reflectivity, and each configured to emit light of one wavelength out of two or more different wavelengths, the organic layer including an organic electroluminescence layer; and
a black matrix layer provided on light emission side of the second electrode, and having first apertures for the respective pixels, the black matrix layer having inclined surfaces inside the respective first apertures, and inclination angles of the inclined surfaces being set, based on emission wavelengths of the pixels.

This application claims the benefit of Japanese Priority Patent Application No. JP 2014-017438 filed in the Japan patent office on Jan. 31, 2014, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An organic electroluminescence device comprising:
a plurality of pixels respectively configured to emit a predetermined light color from among a plurality of different light colors, each of the pixels respectively including a first electrode having light reflectivity, a second electrode, and an organic layer therebetween, the organic layer including an organic electroluminescence layer; and
a light shielding portion located on a light emission side of the organic layer, and including first apertures for the respective pixels,
the light shielding portion having a different angular shape for respective pixels based on the different light colors of the pixels.

2. An organic electroluminescence device according to claim 1,
wherein the light shielding portion has inclined surfaces, the inclined surfaces having different inclination angles respectively based on the different light colors of the pixels.

3. The organic electroluminescence device according to claim 2,
wherein the pixels are sealed between a first substrate and a second substrate, and a resin layer is provided between the pixels and the second substrate, and
a transmittance distribution in the resin layer in each of the pixels is set, respectively based on the different light colors of the pixels.

4. The organic electroluminescence device according to claim 3,
wherein the plurality of different light colors include red light, green light and blue light.

5. The organic electroluminescence device according to claim 4,
wherein the plurality of different light colors include white light.

6. An electronic apparatus provided with an organic electroluminescence device, the organic electroluminescence device comprising:
a plurality of pixels respectively configured to emit a predetermined color light from among a plurality of different light colors, each of the pixels respectively including a first electrode having light reflectivity, a second electrode, and an organic layer therebetween, the organic layer including an organic electroluminescence layer; and
a light shielding portion arranged on a light emission side of the organic layer, and having first apertures for the respective pixels,
the light shielding portion having a different angular shape for respective pixels based on the different light colors of the pixels.

7. The electronic apparatus according to claim 6,
wherein the light shielding portion has inclined surfaces, the inclined surfaces having different inclination angles respectively based on the different light colors of the pixels.

8. The electronic apparatus according to claim 7,
wherein the pixels are sealed between a first substrate and a second substrate, and a resin layer is provided between the pixels and the second substrate, and
a transmittance distribution in the resin layer in each of the pixels is set, respectively based on the different light colors of the pixels.

9. The electronic apparatus according to claim 8,
wherein the plurality of different light colors include red light, green light and blue light.

10. The electronic apparatus according to claim 9,
wherein the plurality of different light colors include white light.

* * * * *